US012641846B2

(12) United States Patent
Tsuji

(10) Patent No.: US 12,641,846 B2
(45) Date of Patent: May 26, 2026

(54) SILICON CARBIDE SEMICONDUCTOR DEVICE

(71) Applicant: FUJI ELECTRIC CO., LTD., Kawasaki (JP)

(72) Inventor: Takashi Tsuji, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 249 days.

(21) Appl. No.: 18/340,233

(22) Filed: Jun. 23, 2023

(65) Prior Publication Data

US 2024/0063304 A1 Feb. 22, 2024

(30) Foreign Application Priority Data

Aug. 19, 2022 (JP) ................................. 2022-131373

(51) Int. Cl.
*H10D 62/10* (2025.01)
*H10D 30/66* (2025.01)
(Continued)

(52) U.S. Cl.
CPC ......... *H10D 62/127* (2025.01); *H10D 30/665* (2025.01); *H10D 30/668* (2025.01); *H10D 62/393* (2025.01); *H10D 62/8325* (2025.01)

(58) Field of Classification Search
CPC ......... H10D 30/655; H10D 30/66–669; H10D 62/127; H10D 12/441–491; H10D 12/415
See application file for complete search history.

(56) References Cited

U.S. PATENT DOCUMENTS 10,026,812 B2 * 7/2018 Nishimura ............... H10D 8/00
2020/0006494 A1 1/2020 Tsuji et al.
(Continued)

FOREIGN PATENT DOCUMENTS

JP 2020-004876 A 1/2020
JP 2020129624 A 8/2020
(Continued)

OTHER PUBLICATIONS

Office Action issued for corresponding Japanese Patent Application No. 2022-131373, and its English translation, dated Mar. 31, 2026.

*Primary Examiner* — Lauren R Bell
(74) *Attorney, Agent, or Firm* — Rabin & Berdo, P.C.

(57) ABSTRACT

A $p^{++}$-type outer peripheral contact region is provided in an edge termination region and surrounds a periphery of an active region in a rectangular shape having rounded corners, in a plan view. The $p^{++}$-type outer peripheral contact region faces a gate runner on a front surface of a semiconductor substrate via an insulating layer. In the active region, a $p^{++}$-type region is provided facing a gate pad on the front surface of the semiconductor substrate via the insulating layer. The $p^{++}$-type outer peripheral contact region and the $p^{++}$-type region are provided apart from $p^{++}$-type contact regions that form source contacts with a source electrode. The $p^{++}$-type contact regions and contact holes in which the source contacts are formed are disposed in a uniform layout spanning an entire area of the active region so that an end side and a center side of the active region have the same layout.

13 Claims, 17 Drawing Sheets

(51) Int. Cl.
H10D 62/17 (2025.01)
H10D 62/832 (2025.01)

(56) References Cited

U.S. PATENT DOCUMENTS

| | | | | |
|---|---|---|---|---|
| 2020/0161467 | A1* | 5/2020 | Takeuchi | ............ H10D 62/393 |
| 2020/0258991 | A1 | 8/2020 | Hoshi | |
| 2020/0328273 | A1* | 10/2020 | Sakata | ................ H10D 30/665 |
| 2020/0328301 | A1* | 10/2020 | Araoka | ............. H10D 62/8325 |
| 2022/0059649 | A1 | 2/2022 | Zaima et al. | |
| 2023/0299178 | A1 | 9/2023 | Nishiwaki et al. | |

FOREIGN PATENT DOCUMENTS

| | | | |
|---|---|---|---|
| JP | 2022034808 A | 3/2022 | |
| JP | 2023135791 A | 9/2023 | |

* cited by examiner

CHIP CENTER SIDE                                              CHIP END SIDE

FIG.7A

| DEVICE STRUCTURE | SAMPLE NO. | $p^{++}$-TYPE CONTACT REGION LAYOUT | | AMOUNT OF AREA OCCUPIED BY $p^{++}$-TYPE CONTACT REGION |
|---|---|---|---|---|
| | | LAYOUT AT END OF ACTIVE REGION | LAYOUT IN ENTIRE AREA OF ACTIVE REGION | |
| TRENCH GATE STRUCTURE | 1 | UNIFORM | STRIPE PATTERN | 22.2% |
| | 2 | UNIFORM | STRIPE PATTERN | 20% |
| | 3 | UNIFORM | STRIPE PATTERN | 14.2% |
| PLANAR GATE STRUCTURE | 4 | UNIFORM | DOT PATTERN | 16.7% |
| | 5 | WIDE UPPER AND LOWER WIDTHS | DOT PATTERN | 13.7% |
| | 6 | WIDE UPPER AND LOWER WIDTHS WIDE CORNER (r=30μm) | DOT PATTERN | 13.7% |
| | 7 | WIDE UPPER AND LOWER WIDTHS WIDE CORNER (r=300μm) | DOT PATTERN | 13.7% |

FIG. 7B

| MEASUREMENT NO. | MEASUREMENT CONDITIONS | SAMPLE 1 | SAMPLE 2 | SAMPLE 3 | SAMPLE 5 | SAMPLE 6 | SAMPLE 7 |
|---|---|---|---|---|---|---|---|
| 1 | 100A/cm²-20 MIN. | - | - | - | 0/2 | 0/4 | 0/5 |
| 2 | 200A/cm²-20 MIN. | - | - | - | 0/2 | 0/4 | 4/5 |
| 3 | 300A/cm²-20 MIN. | - | - | - | 0/2 | 0/4 | 4/5 |
| 4 | 100A/cm²-60 MIN. | 0/5 | 0/3 | 0/5 | 0/2 | 0/4 | 4/5 |
| 5 | 400A/cm²-5 MIN.×2 | 0/5 | 0/3 | 0/5 | 0/2 | 1/4 | 4/5 |
| 6 | 350A/cm²-20 MIN. | 0/5 | 0/3 | 0/5 | 0/2 | 1/4 | 4/5 |
| 7 | 400A/cm²-20 MIN.(pulse) | 0/5 | 0/3 | 0/5 | 0/2 | 1/4 | 5/5 |
| 8 | 500A/cm²-20 MIN.(pulse) | 1/5 | 0/3 | 0/5 | 0/2 | 2/4 | - |
| 9 | 600A/cm²-20 MIN.(pulse) | 1/5 | 2/3 | 1/5 | 2/2 | 4/4 | - |
| 10 | 700A/cm²-20 MIN.(pulse) | 1/5 | 2/3 | 1/5 | - | - | - |
| 11 | 800A/cm²-20 MIN.(pulse) | 2/5 | 2/3 | 1/5 | - | - | - |
| 12 | 900A/cm²-20 MIN.(pulse) | 2/5 | 2/3 | 1/5 | - | - | - |
| 13 | 1000A/cm²-20 MIN.(pulse) | 2/5 | 2/3 | 1/5 | - | - | - |

SILICON CARBIDE SEMICONDUCTOR DEVICE

CROSS REFERENCE TO RELATED APPLICATIONS

This application is based upon and claims the benefit of priority of the prior Japanese Patent Application No. 2022-131373, filed on Aug. 19, 2022, the entire contents of which are incorporated herein by reference.

BACKGROUND OF THE INVENTION

1. Field of the Invention

Embodiments of the invention relate to silicon carbide semiconductor device.

2. Description of the Related Art

Conventionally, a metal oxide semiconductor field effect transistor (MOSFET) having an insulated gate with a three-layered structure including a metal, an oxide film, and a semiconductor further has a body diode built into the semiconductor substrate thereof. The body diode of the MOSFET is a parasitic p-intrinsic-n (pin) diode formed by a pn junction (main junction) between a $p^{++}$-type contact region, a p-type base region, an $n^{-}$-type drift region, and an $n^{+}$-type drain region.

A structure of a conventional SiC-MOSFET that uses silicon carbide (SiC) as a semiconductor material is described. FIG. 8 is a plan view depicting a layout when the conventional silicon carbide semiconductor device is viewed from the front side of a semiconductor substrate thereof. FIGS. 9A, 9B, 10A, 10B, 11A, and 11B are enlarged plan views of a portion of FIG. 8. FIGS. 9A, 9B, 10A, 10B, 11A, and 11B depict examples of different layouts of $p^{++}$-type contact regions 111. FIGS. 9A, 10A, and 11A each depicts a portion (close to a corner of an active region 101) in a rectangular frame AA in FIG. 8 while FIGS. 9B, 10B, and 11B each depicts a portion (close to a corner of a $p^{++}$-type region 114) in a rectangular frame BB in FIG. 8.

A conventional silicon carbide semiconductor device 110 depicted in FIGS. 8 to 11B is a vertical SiC-MOSFET having, in an active region 101, a general trench gate structure (not depicted) provided in a semiconductor substrate 100, at a front side of the semiconductor substrate 100. The trench gate structure is configured by a p-type base region, $n^{+}$-type source regions, the $p^{++}$-type contact regions 111 (refer to FIGS. 9A to 11B), gate trenches, gate insulating films, and gate electrodes. The body diode is formed by a pn junction (not depicted) between the $p^{++}$-type contact regions 111, the p-type base region, an $n^{-}$-type drift region, and an $n^{+}$-type drain region.

The gate trenches extend linearly in a first direction X that is parallel to the front surface of the semiconductor substrate 100. Between any adjacent two of the gate trenches (in a mesa portion), the $n^{+}$-type source regions and the $p^{++}$-type contact regions 111 are selectively provided between the front surface of the semiconductor substrate 100 and the p-type base region and are in contact with the p-type base region. The $n^{+}$-type source regions and the $p^{++}$-type contact regions 111 are in ohmic contact with a source electrode (not depicted) at the front surface of the semiconductor substrate 100, via contact holes 112 of an interlayer insulating film (not depicted).

Each of the $p^{++}$-type contact regions 111 is provided centered between a corresponding two of the gate trenches (not depicted) in a second direction Y that is parallel to the front surface of the semiconductor substrate 100 and orthogonal to the first direction X; the $p^{++}$-type contact regions 111 are apart from the gate trenches and scattered in island-like shapes at a predetermined pitch in the first direction X (FIG. 9A to 11B). A single unit cell (functional unit of a device, portion surrounded by a rectangular frame 103 in FIGS. 9A, 9B) of the SiC-MOSFET is configured by the trench structure that includes one of the island-like shaped $p^{++}$-type contact regions 111, and multiple unit cells are disposed adjacent to one another in both the first and second directions X, Y.

The $p^{++}$-type contact regions 111 are scattered in island-like shapes, whereby a cell pitch (arrangement interval of the unit cells) may be reduced as compared to an instance in which the $p^{++}$-type contact regions 111 extend linearly having substantially the same length as that of the gate trenches in a longitudinal direction of the gate trenches (the first direction X). The $p^{++}$-type contact regions 111, which each has a relatively large surface area as compared to that closer to a center (chip center: center of the semiconductor substrate 100) of the active region 101, are disposed in a vicinity of an inner periphery of a $p^{++}$-type outer peripheral contact region 113 that surrounds a periphery of the active region 101 and a vicinity of an outer periphery of the $p^{++}$-type region 114 directly beneath a gate pad (not depicted), etc.

As an example of a layout of the $p^{++}$-type contact regions 111, in a known structure, at portions 104a, 104b facing the $p^{++}$-type outer peripheral contact region 113 and/or portions 105a, 105b facing the $p^{++}$-type region 114 directly beneath the gate pad, the $p^{++}$-type contact regions 111 extend to be relatively long in the first direction X (FIGS. 9A to 11B). Further, a structure is known in which at the portions 104b, 105b facing the $p^{++}$-type outer peripheral contact region 113 and the $p^{++}$-type region 114 in the second direction Y, a width w101 of the $p^{++}$-type contact regions 111 is relatively wide in the second direction Y (FIGS. 9A, 10A, 11A).

Further, a structure is known in which an end 111a of an outermost (closest to a chip end: closest to an end of the semiconductor substrate 100) one of the $p^{++}$-type contact regions 111 in the second direction Y has, in a plan view of the device, a fan-like shape with a center angle of 90 degrees and an arc-shape along an inner periphery of a corner 113a, at the portion 104c facing the corner 113a of the $p^{++}$-type outer peripheral contact region 113. Further, a structure is known in which in the portion 104c, the $p^{++}$-type contact regions 111 adjacent to the fan-like shaped end 111a of the outermost one of the $p^{++}$-type contact regions 111 extend to be relatively long in the first direction X (FIGS. 10A, 11A).

The end 111a of the outermost one of the $p^{++}$-type contact regions 111 in the second direction Y has a width corresponding to a radius R101 of the fan-like shape in the plan view and is disposed protruding between the $p^{++}$-type outer peripheral contact region 113 and an adjacent one pf the $p^{++}$-type contact regions 111 adjacent to the end 111a at the inner side thereof in the second direction Y (FIGS. 10A, 11A). FIG. 11A depicts an instance in which the radius R101 of the end 111a of the $p^{++}$-type contact region 111 is about 10 times larger as compared to that in FIG. 10A. The contact holes 112 have substantially a same size and substantially a same shape in the plan view as that of the $p^{++}$-type contact regions 111, respectively, exposed by the contact holes 112 (not depicted in FIG. 11A).

The $p^{++}$-type outer peripheral contact region 113 is provided in an edge termination region 102, between the front surface of the semiconductor substrate 100 and the p-type base region (not depicted) and is in contact with the p-type base region. The $p^{++}$-type outer peripheral contact region 113 is electrically connected to the source electrode. The $p^{++}$-type outer peripheral contact region 113, along a border between the active region 101 and the edge termination region 102, surrounds the periphery of the active region 101, which has a substantially rectangular shape in the plan view. The corner 113a of the $p^{++}$-type outer peripheral contact region 113 is curved in an arc shape having a predetermined curvature.

The $p^{++}$-type region 114 is provided in the active region 101, between the front surface of the semiconductor substrate 100 and the p-type base region, so as to be in contact with the p-type base region and face the gate pad on the front surface of the semiconductor substrate 100, via an insulating layer. The $p^{++}$-type region 114 is disposed in a vicinity of the border between the active region 101 and the edge termination region 102 and is electrically connected to the source electrode, via the $p^{++}$-type outer peripheral contact region 113. The $p^{++}$-type region 114 has, in the plan view, a substantially rectangular shape facing an entire area of the surface of the gate pad, which has a substantially rectangular shape in the plan view.

In the conventional silicon carbide semiconductor device 110 described above, unlike during normal operation (state of forward bias between a drain and source), reverse bias between the drain and source occurs during deadtime during synchronous rectification of the SiC-MOSFET and energy regeneration to a load side by the SiC-MOSFET. Thus, the pn junction (main junction) between the $p^{++}$-type contact regions 111, the p-type base region, the $n^-$-type drift region, and the $n^+$-type drain region is forward biased, the body diode conducts, and forward current (hole current) flows through the body diode.

As for a conventional SiC-MOSFET, a device has been proposed in which a $p^{++}$-type outer peripheral contact region is disposed apart from the $n^+$-type source regions in the longitudinal direction of the gate trenches or is disposed apart from the gate trenches in a lateral direction of the gate trenches, whereby current controllability by gate voltage control is enhanced (for example, refer to Japanese Laid-Open Patent Publication No. 2020-004876). In Japanese Laid-Open Patent Publication No. 2020-004876, the $p^{++}$-type contact regions and the contact holes are scattered a predetermined interval in the longitudinal direction of the gate trenches and the $p^{++}$-type contact regions are exposed by the contact holes, respectively.

SUMMARY OF THE INVENTION

According to an embodiment of the invention, a silicon carbide semiconductor device includes: a semiconductor substrate containing silicon carbide and having an active region, the semiconductor substrate having a first main surface and a second main surface opposite to each other; a first semiconductor region of a first conductivity type, provided in the semiconductor substrate; a second semiconductor region of a second conductivity type, provided in the active region, between the first main surface of the semiconductor substrate and the first semiconductor region; a plurality of third semiconductor regions of the first conductivity type, selectively provided between the first main surface and the second semiconductor region; a plurality of fourth semiconductor regions of a second conductivity type, selectively provided between the first main surface and the second semiconductor region, an impurity concentration of the plurality of fourth semiconductor regions being higher than an impurity concentration of the second semiconductor region; a plurality of trenches penetrating through the third semiconductor regions and the second semiconductor region and reaching the first semiconductor region; a plurality of gate electrodes, each provided in a corresponding one of the trenches via a gate insulating film; an interlayer insulating film provided at the first main surface, the interlayer insulating film covering the plurality of gate electrodes; a plurality of contact holes penetrating through the interlayer insulating film in a depth direction of the silicon carbide semiconductor device and reaching the first main surface, thereby exposing respective ones of the plurality of fourth semiconductor regions and respective ones of the plurality of third semiconductor regions; a first electrode in contact with the plurality of third semiconductor regions and the plurality of fourth semiconductor regions, via the plurality of contact holes; and a second electrode in contact with the second main surface of the semiconductor substrate. The plurality of fourth semiconductor regions are regularly disposed in in an entire area of the active region. The plurality of contact holes are regularly disposed in the entire area of the active region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7A is a table showing layouts of $p^{++}$-type contact regions of samples of an experimental example.

FIG. 7B is a table showing verification results for the samples of the experimental example.

DETAILED DESCRIPTION OF THE INVENTION

Figure 1:
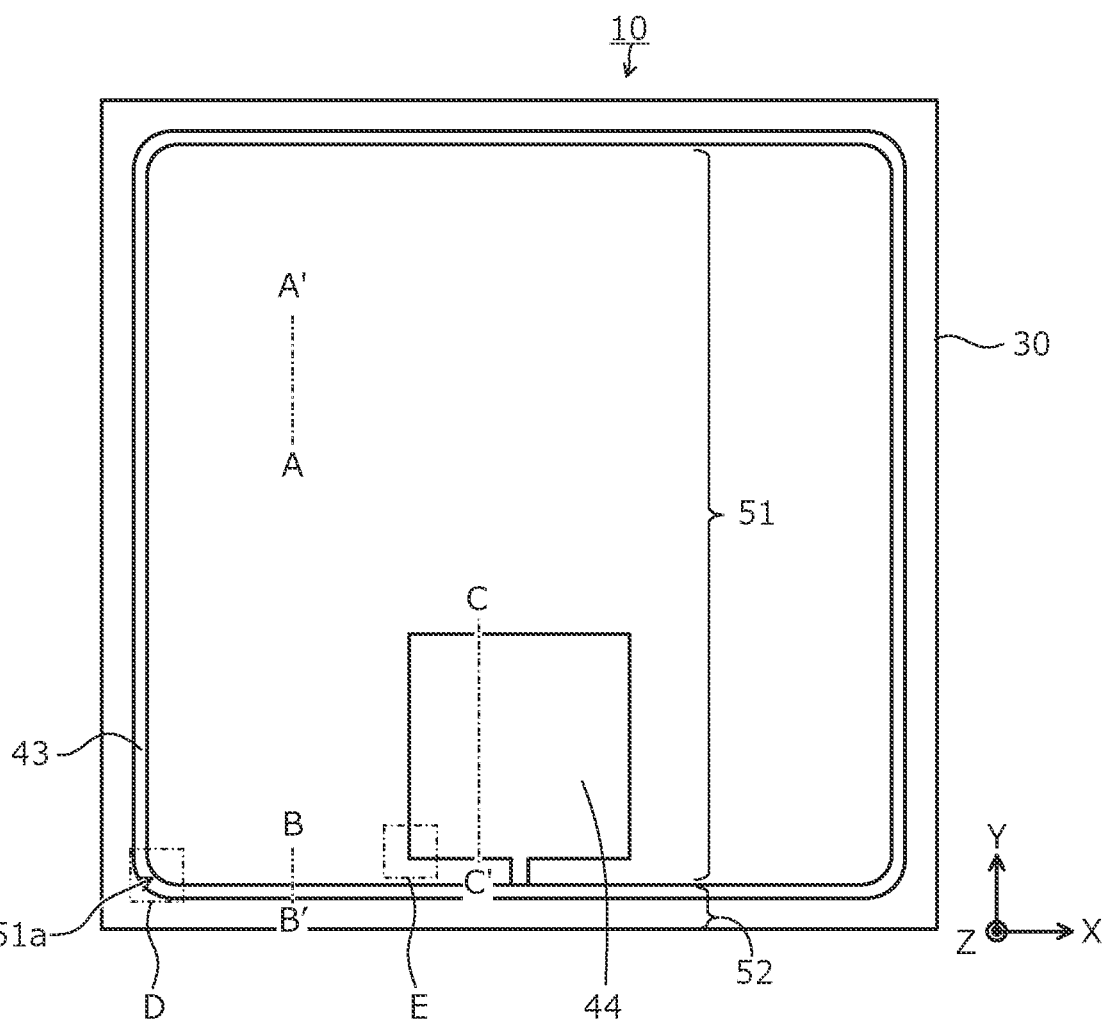
FIG. 1 is a plan view depicting a layout when a silicon carbide semiconductor device according to an embodiment is viewed from a front side of a semiconductor substrate thereof.

First, problems associated with the conventional techniques are discussed. In the conventional silicon carbide semiconductor device 110 described above (refer to FIGS. 8 to 11B), when the body diode conducts (forward conducts), so-called bipolar degradation (degradation of forward conduction due to the body diode) such as increases in on-voltage Von, increases in forward voltage Vf, etc. occur. A reason for this is that, due to conduction of the body diode, basal plane dislocations (BPDs) grow in the semiconductor substrate 100, which contains silicon carbide as a semiconductor material, and the basal plane dislocations become stacking faults (SFs), whereby conduction loss increases.

The semiconductor substrate 100 is formed by epitaxially growing an epitaxial layer of a predetermined conductivity type on an n$^+$-type starting substrate that constitutes the n$^+$-type drain region and the trench structure is formed in the epitaxial layer, at the surface thereof. Due to conduction of the body diode, forward current of the body diode flows, whereby holes that are injected into the n$^-$-type drift region from the p$^{++}$-type contact regions 111, via the p-type base region, recombine with electrons in the n$^-$-type drift region. BPDs of the semiconductor substrate 100 receive energy, such as light that is close to the band gap of silicon carbide and emitted due to this recombination, whereby the BPDs grow into stacking faults.

There are many BPDs in the n$^+$-type starting substrate and typically, BPDs of the n$^+$-type starting substrate grow from an interface between the n$^+$-type starting substrate and an n$^-$-type epitaxial layer (the n$^-$-type drift region), to inside the n$^-$-type drift region, along a (0001) plane and at an angle corresponding to an off-angle (normally, about 4 degrees) in a <11-20> direction and become stacking faults. The stacking faults grow to a vicinity of an interface of the pn junction and further expand in a <1-100> direction in the n$^-$-type drift region. Expansion of the stacking faults progresses in an entire area of the active region in which holes are present at a critical concentration 1 x10$^{15}$/cm$^3$ or greater. The stacking faults are resistance components of electron flow and thus, conduction loss increases and bipolar degradation occurs.

Portions where the p$^{++}$-type contact regions 111 and the contact holes 112 are significantly longer relatively, the portions 104a to 104c, 105a, 105b that have wide widths, and the like have low resistance in the semiconductor substrate 100, forward current (hole current) of body diode easily flows, and hole current density increases. As a result, hole current density at the interface between the n$^+$-type starting substrate and the n$^-$-type epitaxial layer increases and a threshold of stacking fault growth is exceeded. For example, in the conventional structure (refer to FIGS. 8 to 11B), it was confirmed by the inventor that stacking faults appear, when the current density of the forward current of the body diode is in a range of 200 A/cm$^2$ to 400 A/cm$^2$.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 2:
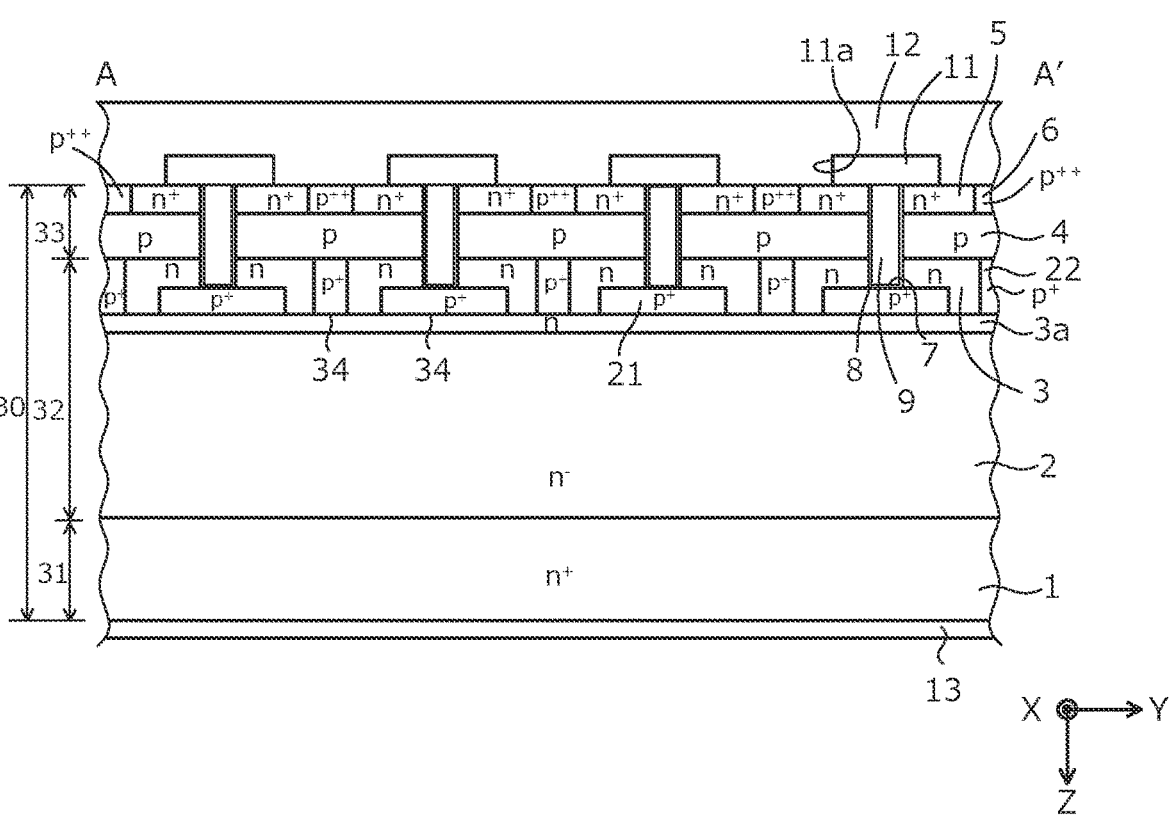
FIG. 2 is a cross-sectional view along cutting line A-A in FIG. 1.
Figure 3:
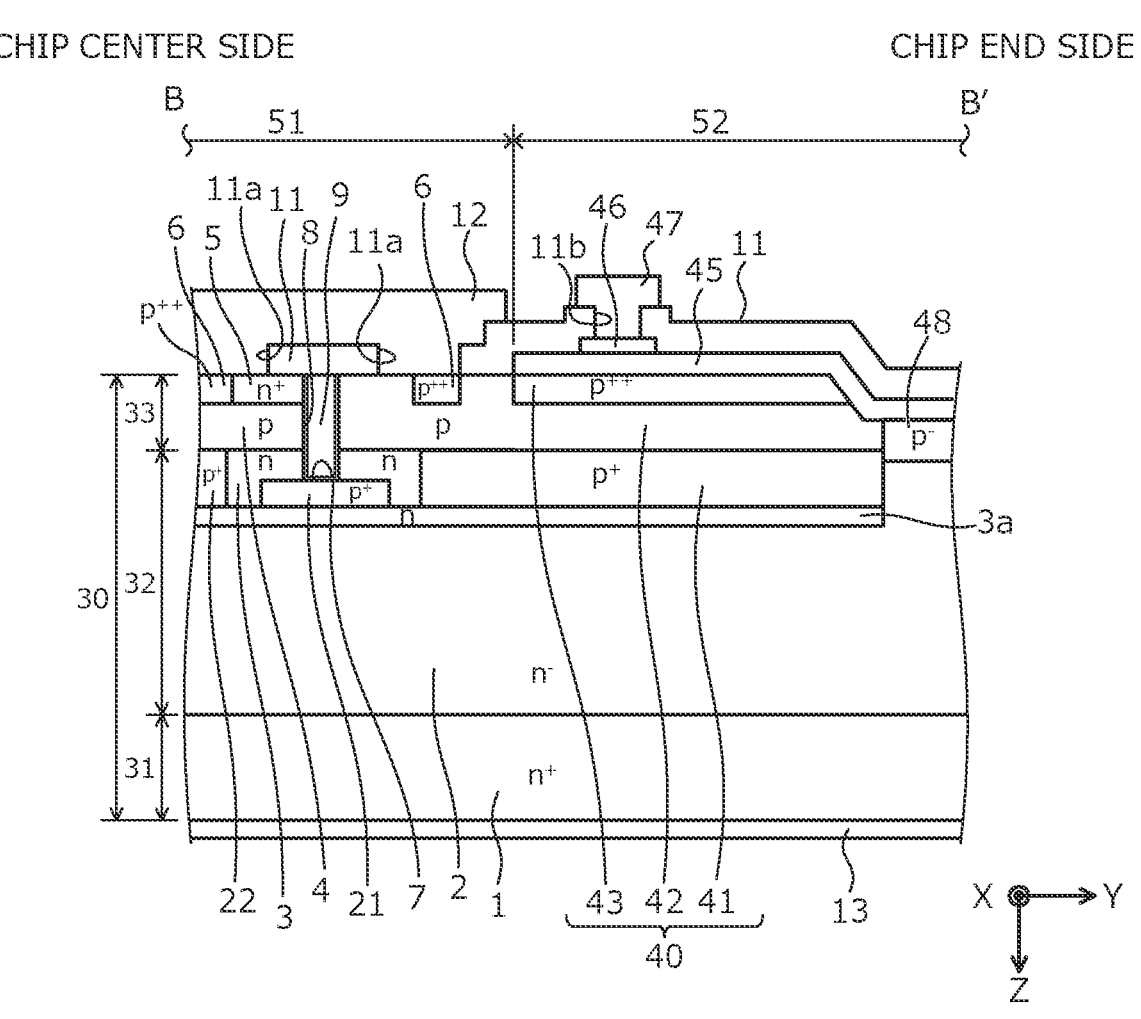
FIG. 3 is a cross-sectional view along cutting line B-B' in FIG. 1.
Figure 4:
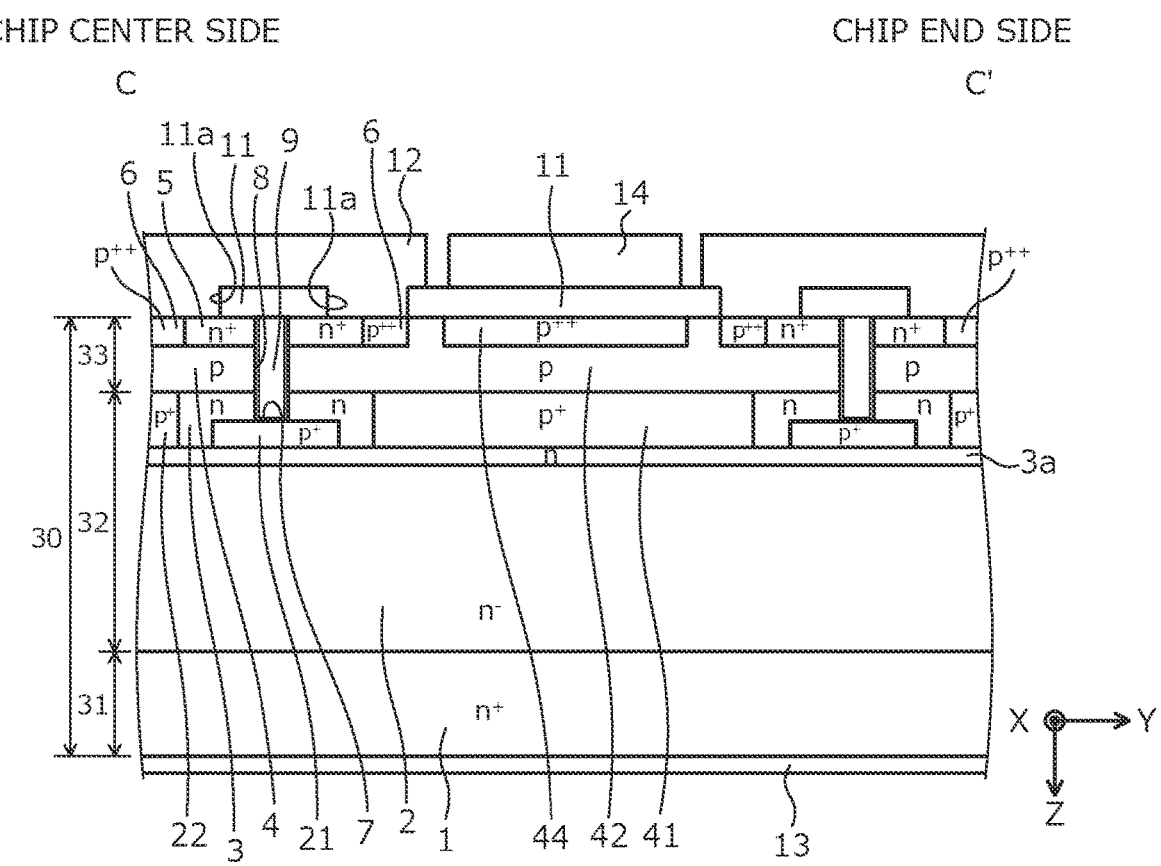
FIG. 4 is a cross-sectional view along cutting line C-C' in FIG. 1.

A structure of a silicon carbide semiconductor device according to an embodiment is described. FIG. 1 is a plan view depicting a layout when the silicon carbide semiconductor device according to the embodiment is viewed from a front side of a semiconductor substrate thereof. FIGS. 2, 3, and 4 are cross-sectional views along cutting line A-A', cutting line B-B', and cutting line C-C' in FIG. 1, respectively. FIG. 2 depicts a cell structure of a SiC-MOSFET disposed in an active region 51. FIG. 2 depicts four adjacent unit cells (functional units of the device). FIG. 3 depicts the structure of a portion of an edge termination region 52. FIG. 4 depicts the structure directly beneath a gate pad 14 (side thereof facing an n$^+$-type drain region 1).

Figure 5A:
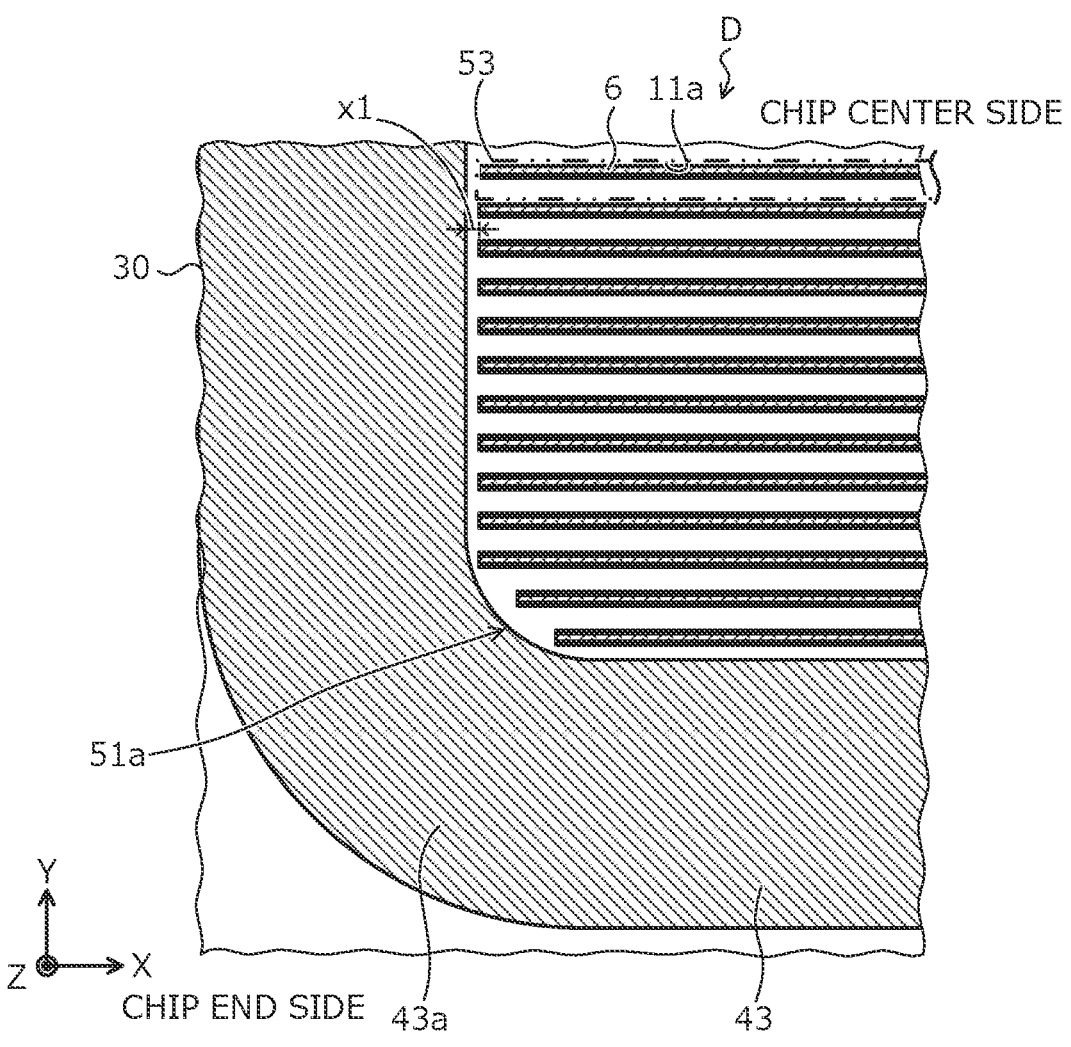
FIG. 5A is an enlarged plan view of an example of a layout of a portion of FIG. 1.
Figure 5B:
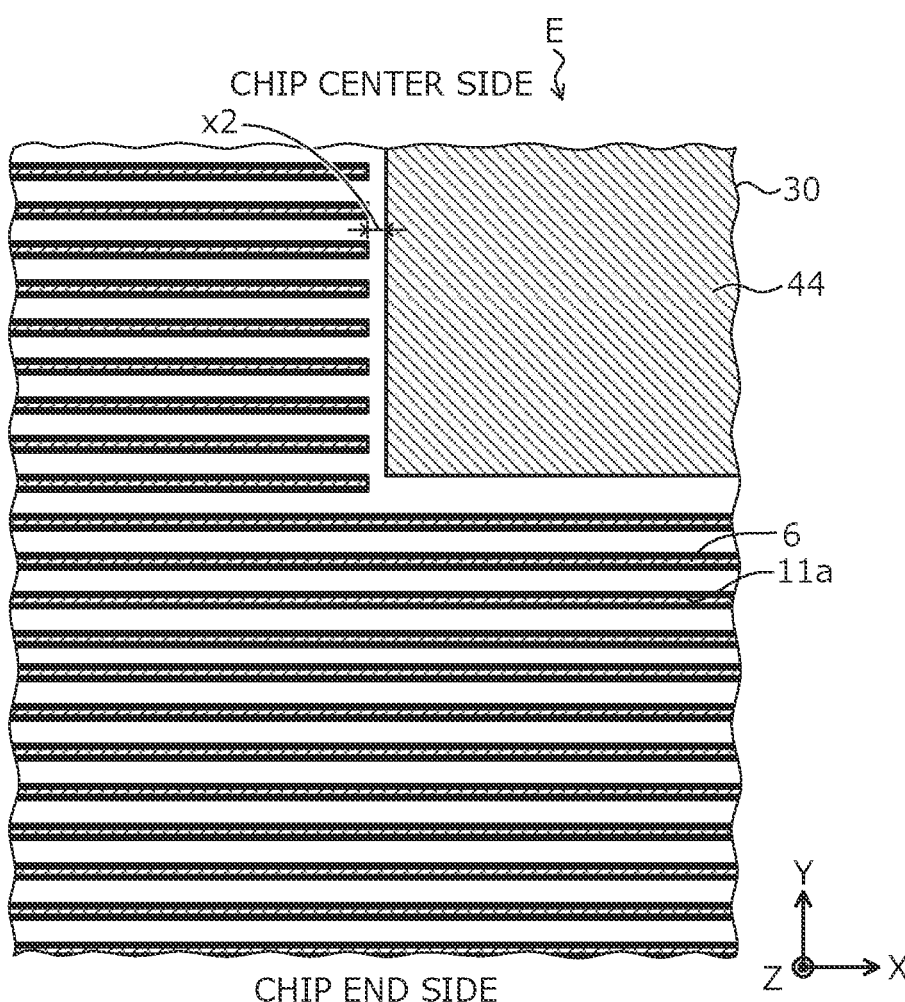
FIG. 5B is an enlarged plan view of an example of a layout of a portion of FIG. 1.
Figure 6A:
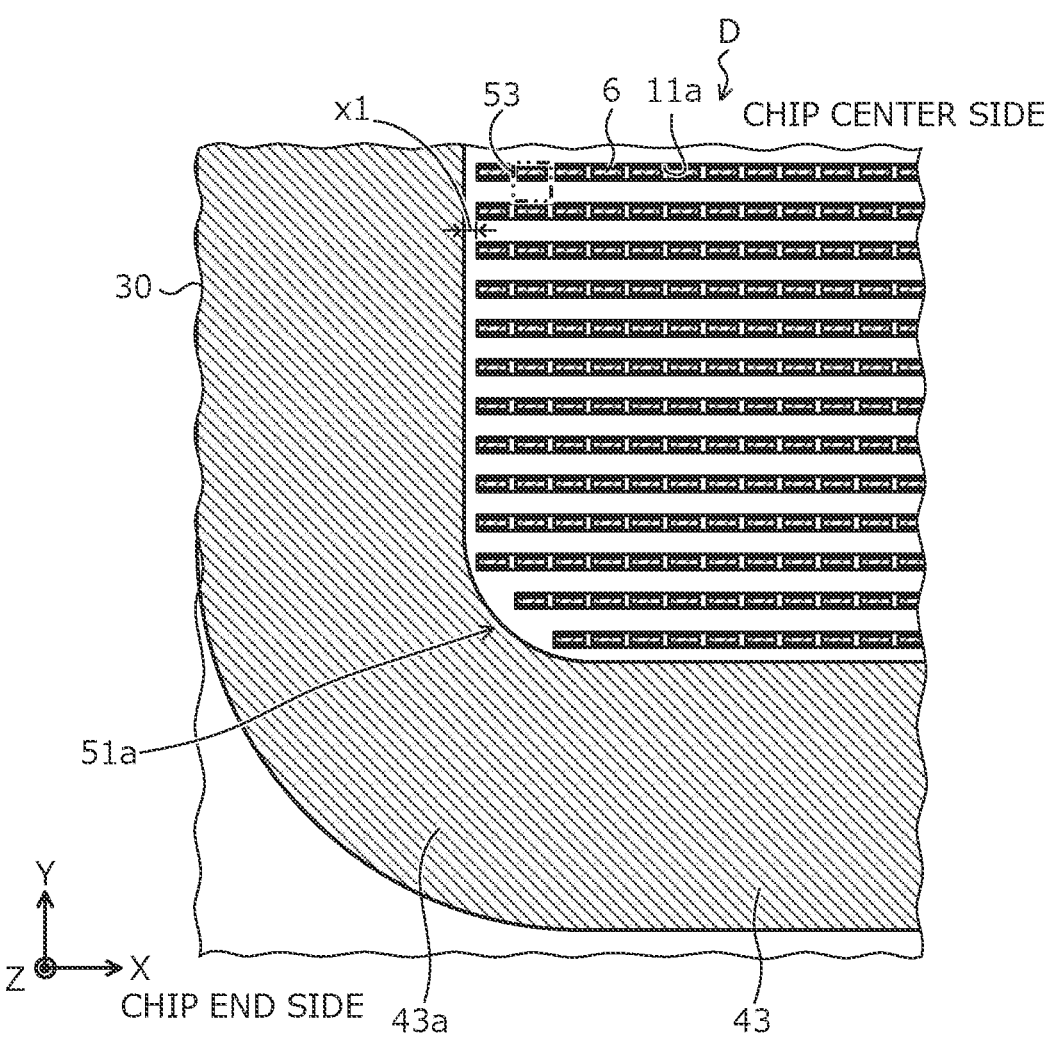
FIG. 6A is an enlarged plan view of an example of a layout of a portion of FIG. 1.
Figure 6B:
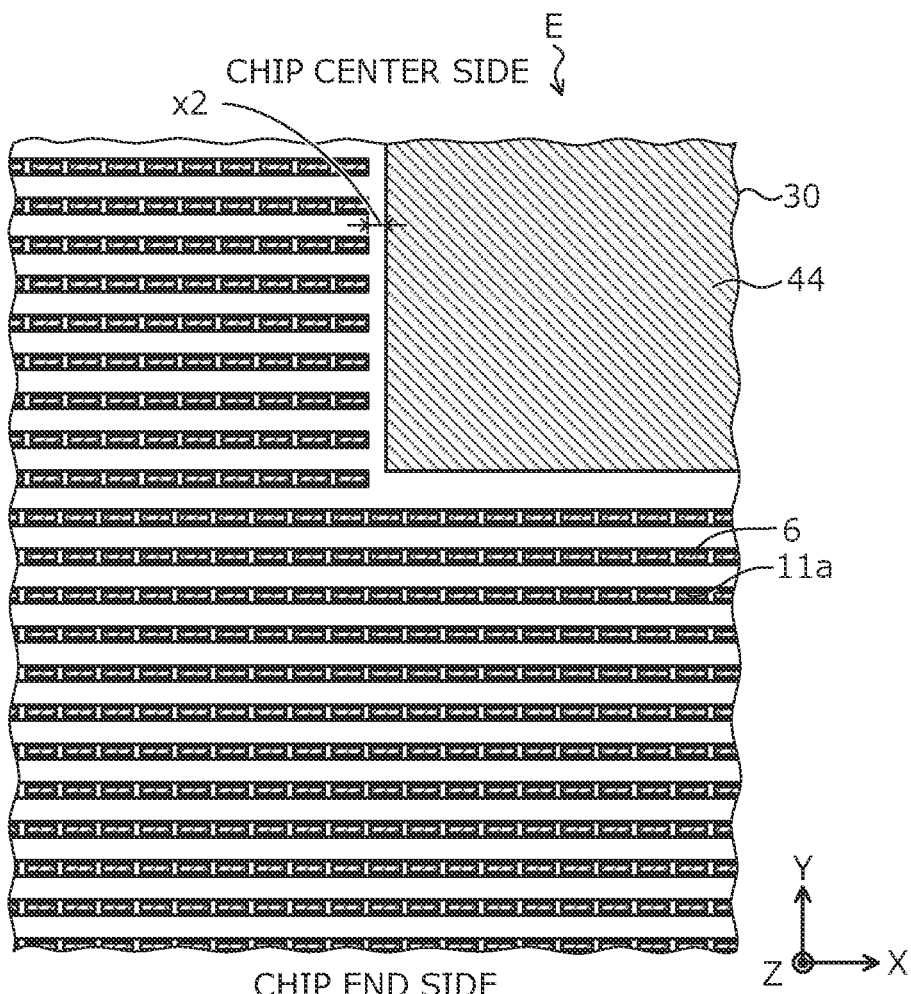
FIG. 6B is an enlarged plan view of an example of a layout of a portion of FIG. 1.
Figure 8:
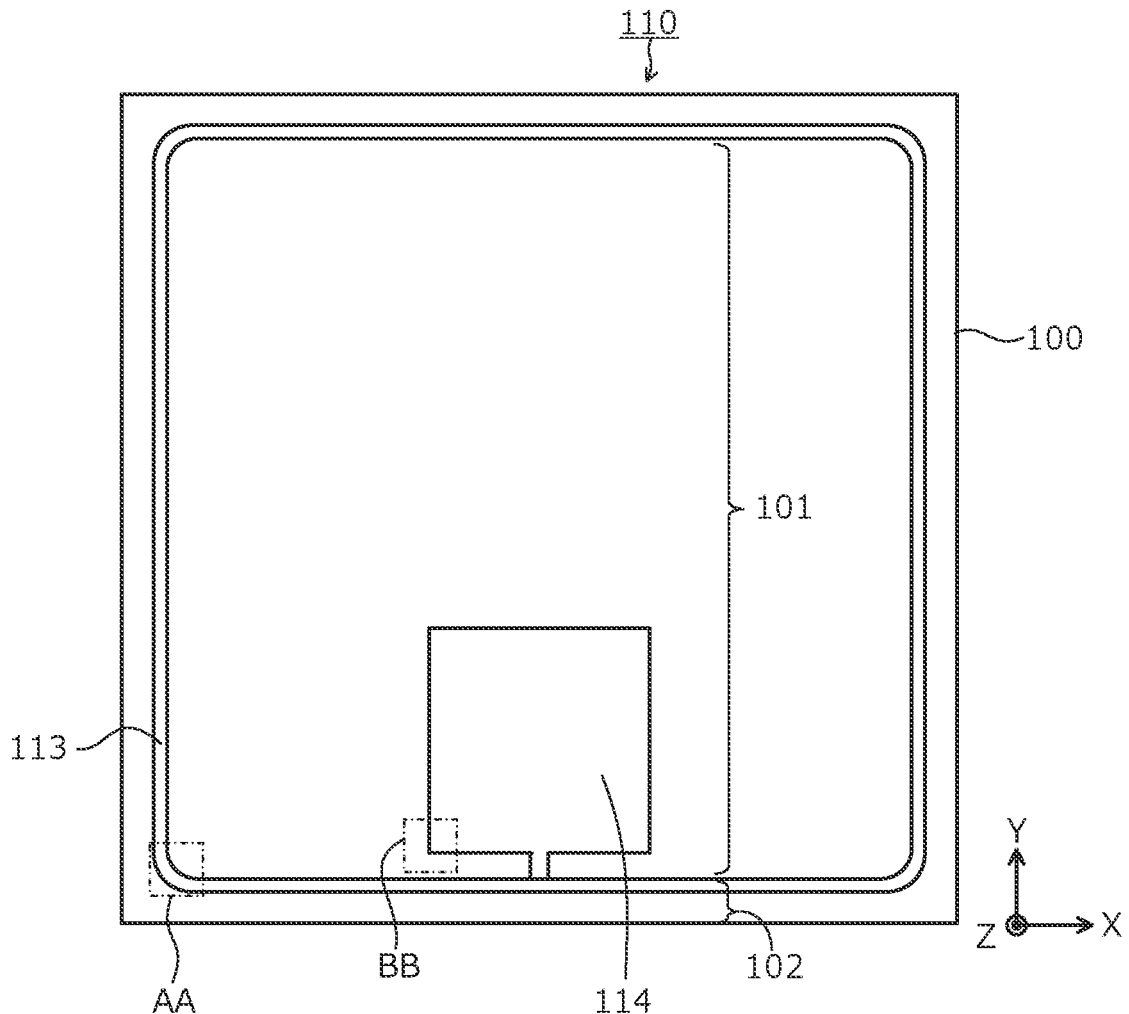
FIG. 8 is a plan view depicting a layout when a conventional silicon carbide semiconductor device is viewed from a front side of a semiconductor substrate thereof.

FIGS. 5A, 5B, 6A and 6B are enlarged plan views of examples of layouts of a portion of FIG. 1. FIGS. 5A, 5B, 6A and 6B depict examples of different layouts of p$^{++}$-type contact regions 6. FIGS. 5A and 6A depict a portion (vicinity of a corner (vertex portion of a rectangle) 51a of the active region 51) in a rectangular frame D in FIG. 1; FIGS. 5B and 6B depict a portion (vicinity of a corner of a p$^+$-type region 44 directly beneath a gate pad 14) in a rectangular frame E in FIG. 1. In FIGS. 5A, 5B, 6A and 6B, to clearly depict the layout of the p$^{++}$-type contact regions 6, among portions configuring a trench structure in the active region 51, only the p$^{++}$-type contact regions 6 and contact holes 11a are depicted while the other portions are not depicted.

A silicon carbide semiconductor device 10 according to the embodiment depicted in FIGS. 1 to 6B is a vertical SiC-MOSFET having, in a semiconductor substrate (semiconductor chip) 30 thereof containing silicon carbide, a trench structure in a front side of the semiconductor substrate 30, in the active region 51. The active region 51 is a region through which a main current (drift current) flows in a direction orthogonal to a front surface of the semiconductor substrate 30, when the silicon carbide semiconductor device 10 is on. The unit cells each having the same structure of the SiC-MOSFET are disposed adjacent to one another in the active region 51. The active region 51 has, in a plan view of the silicon carbide semiconductor device 10, for example, a substantially rectangular shape in which a corner 51a that is chamfered and curved into an arc; the active region 51 is provided in substantially a center (the chip center) of the semiconductor substrate 30.

The edge termination region 52 is a region between the active region 51 and an end (chip end) of the semiconductor substrate 30 and surrounds a periphery of the active region 51 in substantially a rectangular shape. The edge termination region 52 has a function of mitigating electric field of the front side of the semiconductor substrate 30 and sustaining a breakdown voltage. The breakdown voltage is a usage voltage limit at which no malfunction or destruction of the silicon carbide semiconductor device 10 occurs. In the edge termination region 52, for example, a general voltage withstanding structure such as a junction termination extension (JTE) structure, a field limiting ring (FLR) configured by a p-type region 48, etc. is disposed.

The semiconductor substrate 30 is formed by sequentially growing epitaxial layers 32, 33 constituting an n$^-$-type drift region (first semiconductor region) 2 and p-type base regions (second semiconductor regions) 4, respectively, on a front surface of an n$^+$-type starting substrate 31 that contains silicon carbide. The semiconductor substrate 30 has, as the front surface, a first main surface having the p-type epitaxial layer 3 and has, as a back surface, a second main surface having the n$^+$-type starting substrate 31 (back surface of the n$^+$-type starting substrate 31). The front surface of the n$^+$-type starting substrate 31 is, for example, a (0001) plane having an off-angle of about 4 degrees in a <11-20> direction. The n$^+$-type starting substrate 31 is the n$^+$-type drain region (seventh semiconductor region) 1.

The trench structure is configured by the p-type base regions 4, n$^+$-type source regions (third semiconductor regions) 5, the p$^{++}$-type contact regions (fourth semiconductor regions) 6, gate trenches 7, gate insulating films 8, and gate electrodes 9. The gate trenches 7 penetrate through the p-type epitaxial layer 33 in a depth direction Z from the front surface of the semiconductor substrate 30, reach the n$^-$-type epitaxial layer (first-conductivity-type epitaxial layer) 32, and terminate in later-described n-type JFET regions 3. The gate trenches 7 extend linearly in the first direction X, which is parallel to the front surface of the semiconductor substrate 30.

A longitudinal direction (the first direction X) of the gate trenches 7 is, for example, a <11-20> direction and a lateral direction (the second direction Y, which is parallel to the front surface of the semiconductor substrate 30 and orthogonal to the first direction X) of the gate trenches 7 is, for example, a <1-100> direction. The gate electrodes 9 are provided in the gate trenches 7, respectively, via the gate insulating films 8, respectively. Between any adjacent two of the gate trenches 7 (in a mesa portion), the p-type base regions 4, n$^+$-type source regions 5, and the p$^{++}$-type contact regions 6 are each selectively provided between the front surface of the semiconductor substrate 30 and the n$^-$-type drift region 2.

A body diode (parasitic pin diode) is formed by a pn junction (main junction) 34 between the p$^{++}$-type contact regions 6, the p-type base regions 4, later-described p$^+$-type regions 21, 22, a later-described n-type JFET regions 3, a later-described n-type current spreading region 3*a*, the n$^-$-type drift region 2, and the n$^-$-type drain region 1. The n$^+$-type source regions 5 and the p$^{++}$-type contact regions 6 are diffused regions formed by ion-implantation in the p-type epitaxial layer 33. In the p-type epitaxial layer 33, a portion thereof excluding the diffused regions formed by ion implantation constitutes the p-type base regions 4. The p-type base regions 4 are provided spanning an entire area between the gate trenches 7 that are adjacent to one another.

The n$^+$-type source regions 5 and the p$^{++}$-type contact regions 6 are selectively provided between the front surface of the semiconductor substrate 30 and the p-type base regions 4. The n$^+$-type source regions 5 and the p$^{++}$-type contact regions 6 each form, at the front surface of the semiconductor substrate 30, an ohmic contact with a source electrode (first electrode) 12 and has a lower surface (surface facing the n$^+$-type drain region 1) in contact with the p-type base regions 4. The n$^+$-type source regions 5 are in contact with the gate insulating films 8 at sidewalls of the gate trenches 7 and extend substantially a same length (length in the longitudinal direction) in the first direction X as that of the gate trenches 7. The p$^{++}$-type contact regions 6 are provided apart from the gate trenches 7 and adjacent to the n$^+$-type source regions 5. The p$^{++}$-type contact regions 6 are disposed in a uniform layout spanning an entire area of the active region 51.

The p$^{++}$-type contact regions 6 being disposed in a uniform layout means the following. The p$^{++}$-type contact regions 6 are provided having substantially the same shape in the plan view of the silicon carbide semiconductor device and substantially the same dimensions in all the mesa portions. In particular, each of the p$^{++}$-type contact regions 6, for example, in substantially a center of each of the mesa portions in the second direction Y, has substantially the same width (width in the second direction Y) and substantially the same length in the first direction X and extends linearly (FIGS. 5A and 5B), or the p$^{++}$-type contact regions 6 each has substantially the same dimensions and substantially the same shape in the plan view and are apart from one another (scattered) in island-like shapes at a predetermined pitch in the first direction X (FIGS. 6A and 6B). In other words, the p$^{++}$-type contact regions 6 are provided in a stripe pattern and all terminate at substantially the same position in the first direction X or have substantially the same dimensions and substantially the same shape in the plan view and are provided in dot shapes apart from one another at equal intervals and equal in number in the first direction X (matrix-like pattern).

In the first direction X, a shortest distance x1 from the p$^{++}$-type contact regions 6 to a later-described p$^{++}$-type outer peripheral contact region 43 in the edge termination region 52, preferably, may be substantially the same in all the mesa portions. In this instance, all the gate trenches 7 terminate at substantially the same position in the first direction X. In other words, even when the corner 51*a* of the active region 51 is curved into an arc-shape, the end of the outermost one (closest to the chip end) of the p$^{++}$-type contact regions 6 in the second direction Y does not terminate closer to the chip center in the first direction X than are the ends of the other p$^{++}$-type contact regions 6 like in the conventional structure (refer to FIG. 9A) but rather is terminated at substantially the same position in the first direction X as the ends of the other p$^{++}$-type contact regions 6.

In the first direction X, even an in instance in which the shortest distance x1 from the p$^{++}$-type contact regions 6 to the p$^{++}$-type outer peripheral contact region 43 is relatively and slightly longer close to the corner 51*a* of the active region 51 (for example, about 1 μm to 2 μm), the current density of the forward current of the body diode increases about 1% and thus, is acceptable. For example, in an instance in which the p$^{++}$-type contact regions 6 extend linearly in the first direction X, provided that the length (length in the first direction X) of the p$^{++}$-type contact regions 6 whose ends are positioned close to the corner 51*a* of the active region 51 is within −5% of the length of the other p$^{++}$-type contact regions 6, an effect of the present embodiment is obtained.

In the first direction X, the shortest distance x1 from the p$^{++}$-type contact regions 6 to the p$^{++}$-type outer peripheral contact region 43 is a distance in the first direction X from the p$^{++}$-type contact regions 6 (in an instance in which in each of the mesa portions, the p$^{++}$-type contact regions 6 are apart from one another in island-like shapes in the first direction X, an outermost one of the p$^{++}$-type contact regions 6 in the first direction X), to the p$^{++}$-type outer peripheral contact region 43. Further, a width of the p$^{++}$-type contact regions 6 in the second direction Y is substantially the same for all the p$^{++}$-type contact regions 6 and at the end of the outermost one of the p$^{++}$-type contact regions 6 in the second direction Y, the layout in which the width locally increases like in the conventional structure (refer to FIGS. 10A and 11A) is not adopted.

Further, a shortest distance x2, in the first direction X, from the p$^{++}$-type contact regions 6 to the p$^{++}$-type region 44 is substantially the same in all the mesa portions that face a later-described p$^{++}$-type region 44 in the first direction X. The shortest distance x2, in the first direction X, from the p$^{++}$-type contact regions 6 to the p$^{++}$-type region 44 in the mesa portions that face the p$^{++}$-type region 44 in the first direction X is a distance, in the first direction X, from an end of the p$^{++}$-type contact regions 6 (in an instance in which in each of the mesa portions, the p$^{++}$-type contact regions 6 are apart from one another in island-like shapes in the first direction X, an end of a closest one of the $p^{++}$-type contact regions 6 closest to the $p^{++}$-type region 44 in the first direction X), that is, the end thereof that faces the $p^{++}$-type region 44, to the $p^{++}$-type region 44.

Further, the outermost ones of the $p^{++}$-type contact regions 6 in the second direction Y (i.e., the $p^{++}$-type contact regions 6 that face the $p^{++}$-type outer peripheral contact region 43 in the second direction Y) and the closest ones of the $p^{++}$-type contact regions 6 closest to the $p^{++}$-type region 44 in the second direction Y (i.e., the $p^{++}$-type contact regions 6 that face the $p^{++}$-type region 44 in the second direction Y) are disposed in the same layout as that of the $p^{++}$-type contact regions 6 in the center side of the active region 51, and a layout in which the width is greater in the second direction Y than the widths of the other $p^{++}$-type contact regions 6 and a layout in which the shape in the plan view differs like in the conventional structure (refer to FIGS. 10A, 10B, 11A, and 11) are not adopted.

In this manner, even when the corner 51a of the active region 51 curves in an arc-shape and the $p^{++}$-type region 44 is partially disposed in the active region 51, the $p^{++}$-type contact regions 6 are disposed in a uniform layout spanning an entire area of the active region 51 so that the center side and the end side of the active region 51 both have substantially the same layout. The $p^{++}$-type contact regions 6 of the embodiment are free of portions that are relatively significantly longer and portions that have wide widths like those portions in the conventional structure (corresponds to portions indicated by reference characters 104a, 104b, 104c, 105a, 105b in FIGS. 9A to 11B). Substantially the same length, substantially the same shape, and substantially the same distance mean, respectively, the same length, the same shape, and the same distance within a range that includes an allowable error due to manufacturing process variation.

One unit cell of the SiC-MOSFET is configured by the trench structure that includes one of the $p^{++}$-type contact regions 6. In particular, in an instance in which the $p^{++}$-type contact regions 6 extend linearly in the first direction X, the unit cell (portion surrounded by a two-dot/single-dashed line 53 in FIGS. 5A and 5B) of the SiC-MOSFET has a linear shape extending in the first direction X and is disposed in plural adjacent to one another in the second direction Y. In an instance in which the $p^{++}$-type contact regions 6 are apart from another in island-like shapes, each unit cell (portion surrounded by the two-dot/single-dashed line 53 in FIGS. 6A and 6B) of the SiC-MOSFET is provided in an island-like shape, the unit cells are provided adjacent to one another in the first and second directions X, Y, at the same pitch as that of the $p^{++}$-type contact regions 6.

Further, in the active region 51, between the front surface of the semiconductor substrate 30 and the p-type base regions 4, the $p^{++}$-type region (sixth semiconductor region) 44 is selectively provided adjacent to the p-type base regions 4 but apart from the $n^+$-type source regions 5 and the $p^{++}$-type contact regions 6. The $p^{++}$-type region 44 faces the gate pad 14 on the front surface of the semiconductor substrate 100, via an interlayer insulating film 11. The $p^{++}$-type region 44 is continuous with the later-described $p^{++}$-type outer peripheral contact region 43 and is electrically connected to the source electrode 12, via the $p^{++}$-type outer peripheral contact region 43. The $p^{++}$-type region 44 has substantially the same dimensions and substantially the same shape in the plan view as that of the gate pad 14 and the $p^{++}$-type region 44 faces an entire area of the surface of the gate pad 14.

The $p^{++}$-type region 44 is diffused region formed in the p-type epitaxial layer 33 by ion implantation. The $p^{++}$-type region 44, for example, is formed concurrently with the $p^{++}$-type contact regions 6. The unit cells of the SiC-MOSFET may be disposed between the $p^{++}$-type region 44 and the later-described $p^{++}$-type outer peripheral contact region 43. The $p^{++}$-type contact regions 6 of the unit cells disposed between the $p^{++}$-type region 44 and the $p^{++}$-type outer peripheral contact region 43 are also disposed in the same layout as that of the $p^{++}$-type contact regions 6 of the other unit cells and thus, as described above, the layout of the $p^{++}$-type contact regions 6 is uniform spanning an entire area of the active region 51.

Between the $n^-$-type drift region 2 and the p-type base regions 4, at deep positions closer to the $n^+$-type drain region 1 than are bottoms of the gate trenches 7, the $p^+$-type regions 21, 22, and the n-type JFET regions 3 are selectively provided. The n-type current spreading region 3a is provided between the $n^-$-type drift region 2 and the $p^+$-type regions 21, 22 and the n-type JFET regions 3. An impurity concentration of the n-type current spreading region 3a is substantially the same as that of the n-type JFET regions 3 or is an impurity concentration between that of the n-type JFET regions 3 and that of the $n^-$-type drift region 2. The $p^+$-type regions 21, 22, the n-type JFET regions 3, and the n-type current spreading region 3a are diffused regions formed in the $n^-$-type epitaxial layer 32 by ion implantation. The $p^+$-type regions 21, 22 and the n-type JFET regions 3 may terminate at the same depth positions toward the $n^+$-type drain region 1 or the n-type current spreading region 3a may extend between the $n^-$-type drift region 2 and the $p^+$-type regions 21, 22.

The $p^+$-type regions 21, 22 are fixed to the potential of the source electrode 12 and have a function of mitigating electric field applied to the gate insulating films 8 by depleting when the SiC-MOSFET (the silicon carbide semiconductor device 10) is off (or cause the n-type JFET regions 3 to deplete, or both). The $p^+$-type regions 21, 22 extend linearly and have substantially the same length as that of the gate trenches 7 in the first direction X. The $p^+$-type regions 21 are provided apart from the p-type base regions 4 and face the bottoms of the gate trenches 7 in the depth direction Z, respectively. The $p^+$-type regions 21 may be in contact with the gate insulating films 8 at the bottoms of the gate trenches 7, respectively, or may be apart from the gate trenches 7.

The $p^+$-type regions 22 are provided between the gate trenches 7 that are adjacent to one another and are in contact with the p-type base regions 4 but apart from the gate trenches 7 and the $p^+$-type regions 21. The $p^+$-type regions 22 are provided, respectively, in the mesa portions (between the gate trenches 7 that are adjacent to one another), at substantially the centers of the mesa portions in the second direction Y, the $p^+$-type regions 22 face the $p^{++}$-type contact regions 6 in the depth direction Z. A width (in the second direction Y) of the $p^+$-type regions 22 is suitably set according to a width (in the second direction Y) of an n-type junction FET (JFET) region 3 that is between an adjacent two of the $p^+$-type regions 21, 22, said width may be at least equal to the width (in the second direction Y) of one of the $p^{++}$-type contact regions 6 or may be less than the width (in the second direction Y) of one of the $p^{++}$-type contact regions 6.

In each of the $p^+$-type regions 22, a portion thereof facing the $n^+$-type drain region 1 and a portion thereof facing one of the $n^+$-type source regions 5 may have substantially the same impurity concentration or each of the $p^+$-type regions 22 may have a two-layer structure in which the portion facing the n$^+$-type drain region 1 and the portion facing the n$^+$-type source regions 5 each has a different impurity concentration. The n-type current spreading region 3$a$ is a so-called current spreading layer (CSL) that reduces carrier spreading resistance. The n-type JFET regions 3 are adjacent to the p$^+$-type regions 21, 22, have an upper surface (surface facing the n$^+$-type source regions 5) that is in contact with the p-type base regions 4, and a lower surface (surface facing the n$^+$-type drain region 1) that is in contact with the n-type current spreading region 3$a$. The n-type JFET regions 3 are regions for guiding electron flow in a direction of the lower surface by low resistance.

Further, the n-type JFET regions 3 reach the gate trenches 7 in the second direction Y and are in contact with the gate insulating films 8. The n-type JFET regions 3 may be omitted. In an instance in which the n-type JFET regions 3 are omitted, instead of the n-type JFET regions 3, the n-type current spreading region 3$a$ is between any adjacent two of the p$^+$-type regions 21, 22, reaches the p-type base regions 4, reaches the gate trenches 7 in the second direction Y, and is in contact with the gate insulating films 8. A portion of the n$^-$-type epitaxial layer 32 excluding the diffused regions (the p$^+$-type regions 21, 22, the n-type JFET regions 3, and the n-type current spreading region 3$a$) formed by ion implantation constitutes the n$^-$-type drift region 2.

The interlayer insulating film 11 is provided in an entire area of the front surface of the semiconductor substrate 30 and covers the gate electrodes 9. In the interlayer insulating film 11, the contact holes 11$a$ are provided in a uniform layout spanning an entire are of the active region 51. In other words, the contact holes 11$a$ are provided having substantially the same shape in the plan view and substantially the same dimensions in all the mesa portions, and the contact holes 11$a$ expose the n$^+$-type source regions 5 and the p$^{++}$-type contact regions 6. In particular, the contact holes 11$a$ are provided in the mesa portions, respectively, extend linearly (in a striped pattern at the surface of the active region 51) in the first direction X and have substantially the same width (width in the second direction Y) and substantially the same length in the first direction X. The entire surface of each of the p$^{++}$-type contact regions 6 is exposed by the contact hole 11$a$ that is in the same respective mesa portion.

The source electrode 12 is in ohmic contact with the n$^+$-type source regions 5 and the p$^{++}$-type contact regions 6 at the front surface of the semiconductor substrate 30, via the contact holes 11$a$ of the interlayer insulating film 11, and the source electrode 12 is electrically connected to the n$^+$-type source regions 5, the p$^{++}$-type contact regions 6, and the p-type base regions 4. The source electrode 12 covers substantially an entire area of the front surface of the semiconductor substrate 30 in the active region 51. The source electrode 12, for example, in the plan view, has a substantially rectangular shape (not depicted) in which a portion is recessed inward (toward the chip center). The source electrode 12 further serves as a source pad (electrode pad). On the interlayer insulating film 11 in the active region 51, the gate pad 14 is provided apart from the source electrode 12.

The gate pad 14 is electrically connected to all the gate electrodes 9 via a later-described gate runner. The gate pad 14, for example, has a substantially rectangular shape (not depicted) in the plan view. The gate pad 14, for example, in a vicinity of a border between the active region 51 and the edge termination region 52, is provided in a recess where the portion of the source electrode 12 is recessed and thereby has three sides that face the source electrode 12. A drain electrode (second electrode) 13 is provided in an entire area of the back surface (back surface of the n$^+$-type starting substrate 31) of the semiconductor substrate 30. The drain electrode 13 is in ohmic contact with the semiconductor substrate 30 and is electrically connected to the n$^+$-type drain region 1 (the n$^+$-type starting substrate 31).

In the edge termination region 52, between the active region 51 and the voltage withstanding structure, the p-type base regions 4 extend between the front surface of the semiconductor substrate 30 and the n$^-$-type drift region 2, from the active region 51. Hereinafter, an extended portion of the p-type base regions 4 extending to the edge termination region 52 is regarded as a p-type base extension portion 42. A p$^+$-type region 41 is provided between the n$^-$-type drift region 2 and the p-type base extension portion 42. The p$^+$-type region 41, for example, is a diffused region formed in the p-type epitaxial layer 33 concurrently with the p$^+$-type regions 22 of the active region 51. The p$^+$-type region 41 may extend between the p-type base regions 4 and the n$^-$-type drift region 2 directly beneath (closer to the n$^+$-type drain region 1 than is the gate pad 14) the gate pad 14.

The p$^{++}$-type outer peripheral contact region (fifth semiconductor region) 43 is provided between the front surface of the semiconductor substrate 30 and the p-type base extension portion 42 and is in contact with the p-type base extension portion 42. The p$^{++}$-type outer peripheral contact region 43, for example, is a diffused region formed in the p-type epitaxial layer 33 concurrently with the p$^{++}$-type contact regions 6 of the active region 51. The p$^{++}$-type outer peripheral contact region 43, along the border between the active region 51 and the edge termination region 52, surrounds the periphery of the active region 51 in substantially a rectangular shape. A corner 43$a$ of the p$^{++}$-type outer peripheral contact region 43 is curved having an arc shape of a predetermined curvature. The p$^{++}$-type region 44 is connected to the p$^{++}$-type outer peripheral contact region 43.

The p$^{++}$-type outer peripheral contact region 43 is electrically connected to the source electrode 12, via the p-type base extension portion 42. The p$^{++}$-type outer peripheral contact region 43 has a function of suppressing increases of the potential of a region (p-type outer peripheral region 40) directly beneath the gate pad 14 due to a steep increase in the voltage applied to the drain electrode 13. The surface (the front surface of the semiconductor substrate 30) of the p$^{++}$-type outer peripheral contact region 43 is covered by a field oxide film 45. the p-type outer peripheral region 40, which is formed by stacking the p$^{++}$-type outer peripheral contact region 43, the p-type base extension portion 42, and the p$^+$-type region 41, surrounds the periphery of the active region 51 in substantially a rectangular shape.

In the edge termination region 52, the field oxide film 45 is provided between the front surface of the semiconductor substrate 30 and the interlayer insulating film 11. The field oxide film 45 may extend between the interlayer insulating film 11 and the front surface of the semiconductor substrate 30 in the active region 51 so as to face an entire area of the gate pad 14. Between the active region 51 and the voltage withstanding structure, a gate polysilicon wiring layer 46 is provided between the field oxide film 45 and the interlayer insulating film 11. On the gate polysilicon wiring layer 46, a gate metal wiring layer 47 is provided via a contact hole 11$b$ of the interlayer insulating film 11.

The gate metal wiring layer 47 is connected to the gate pad 14. The gate polysilicon wiring layer 46 and the gate metal wiring layer 47 surround the periphery of the active region 51 and configure the gate runner. The gate electrodes 9 are connected to the gate polysilicon wiring layer 46, at the ends of the gate trenches 7 in the longitudinal direction. Via the gate polysilicon wiring layer 46 and the gate metal wiring layer 47, all the gate electrodes 9 are electrically connected to the gate pad 14. An entire area of the surface of the gate runner, in the depth direction Z, faces all of the $p^{++}$-type outer peripheral contact region 43, the p-type base extension portion 42, and the $p^{+}$-type region 41, via an insulating layer (the field oxide film 45 and the interlayer insulating film 11).

Operation of the silicon carbide semiconductor device 10 according to the embodiment (SiC-MOSFET) is described. During normal operation, voltage that is positive with respect to the source electrode 12 is applied to the drain electrode 13 (forward bias between the drain and source), whereby the pn junction 34 between the $p^{++}$-type contact regions 6, the p-type base regions 4, the $p^{+}$-type regions 21, 22, the n-type JFET regions 3, the n-type current spreading region 3a, the $n^{-}$-type drift region 2, and the $n^{+}$-type drain region 1 is reverse biased. In this state, when the voltage applied to the gate electrodes 9 is less than a gate threshold voltage, the SiC-MOSFET maintains an off-state.

On the other hand, when voltage that is positive with respect to the source electrode 12 is applied to the drain electrode 13 and the voltage applied to the gate electrodes 9 is at least equal to the gate threshold voltage, a channel (n-type inversion layer) is formed in portions of the p-type base regions 4, along the sidewalls of the gate trenches. As a result, a main current (drift current) flows from the $n^{+}$-type drain region 1, through the $n^{-}$-type drift region 2, the n-type current spreading region 3a, the n-type JFET regions 3, and the channel, to the $n^{+}$-type source regions 5, whereby the SiC-MOSFET (the silicon carbide semiconductor device 10) turns on.

Further, during deadtime during synchronous rectification of the SiC-MOSFET or when energy is regenerated to the load-side by the SiC-MOSFET, between the drain and source is reversed biased. Thus, the pn junction 34 between the $p^{++}$-type contact regions 6, the p-type base regions 4, the $p^{+}$-type regions 21, 22, the n-type JFET regions 3, the n-type current spreading region 3a, the $n^{-}$-type drift region 2, and the $n^{+}$-type drain region 1 is forward biased, the body diode conducts (forward conduction), and the forward current of the body diode flows closer to the chip center than is the $p^{++}$-type outer peripheral contact region 43.

As described above, the $p^{++}$-type contact regions 6 and the contact holes 11a are disposed in a uniform layout spanning an entire area of the active region 51, whereby variation of resistance in the semiconductor substrate 30, at the surface of the active region 51 may be suppressed. As a result, at the surface of the active region 51, variation of current density of forward current (hole current) of the body diode may be suppressed and even when the body diode conducts, the hole current density at an interface between the $n^{+}$-type starting substrate 31 and the $n^{-}$-type epitaxial layer 32 is inhibited from exceeding a threshold for stacking fault (SF) growth.

Thus, as compared to the conventional structure (refer to FIGS. 8 to 11B), stacking fault growth from basal plane dislocations (BPD) of the $n^{+}$-type starting substrate 31 during conduction of the body diode may be suppressed. In particular, in the conventional structure, the inventor confirmed that stacking faults appeared when the current density of the forward current of the body diode was in a range of 200 A/cm$^2$ to 400 A/cm$^2$ whereas in the present embodiment, the inventor confirmed that stacking faults appeared when the current density of the forward current of the body diode increased to about 500 A/cm$^2$.

As described above, according to the embodiment, the $p^{++}$-type contact regions forming source contacts with the source electrode and the contact holes where the source contacts are formed are disposed in a uniform layout spanning an entire area of the active region so that the end side and the center side of the active region have the same layout. As a result, variation of internal resistance of the semiconductor substrate, at the surface of the active region may be suppressed and variation of the current density of the forward current (hole current) of the body diode, at the surface of the active region may be suppressed. Thus, even when the body diode conducts, increases in the hole current density at the interface between the $n^{+}$-type starting substrate and the $n^{-}$-type epitaxial layer may be suppressed, and bipolar degradation may be suppressed.

A relationship between the layout of the $p^{++}$-type contact regions 6 and bipolar degradation was verified. FIG. 7A is a table showing layouts of the $p^{++}$-type contact regions of samples of an experimental example. FIG. 7B is a table showing verification results for the samples of the experimental example. In FIG. 7B, the probability of occurrence of a bipolar degradation defect in the samples (semiconductor chips on which vertical SiC-MOSFETs are fabricated) of the experimental example is indicated as a ratio of the number of semiconductor chips in which a bipolar degradation defect occurred (numerator) to the total number of evaluated semiconductor chips (denominator). A semiconductor chip for which the on-voltage Von increases 10% after conduction as compared to before conduction is regarded to have a bipolar degradation defect.

Design conditions for samples 1, 2, 3, 4, 5, 6, and 7 of the experimental example are shown in FIG. 7A. The samples 1 to 4 are each a vertical SiC-MOSFET with a trench structure that has the structure of the silicon carbide semiconductor device 10 according to the embodiment described above (refer to FIGS. 1 to 6) and the $p^{++}$-type contact regions 6 are disposed in a uniform layout spanning an entire area of the active region 51. In particular, in each of the samples 1 to 3, each of the $p^{++}$-type contact regions 6 has the same width and the same length spanning an entire area of the active region 51 and extends linearly in the first direction X, forming a striped pattern (FIGS. 5A and 5B). In the sample 4, each of the $p^{++}$-type contact regions 6 has the same dimensions and the same shape in the plan view spanning an entire area of the active region 51 and is disposed apart from the other $p^{++}$-type contact regions 6 in an island-like shape (dot shape) (FIGS. 6A and 6Bs. 5).

The samples 1 to 3 are assumed to have cell pitches of 4.5 μm, 5 μm, and 7 μm, respectively, and a ratio of an area of the $p^{++}$-type contact regions 6 of one unit cell (hereinafter, amount of the area occupied by the $p^{++}$-type contact regions 6) to an area (surface area) of one unit cell is assumed to be 22.2%, 20%, and 14.2% for the samples 1 to 3, respectively. In the sample 4, the cell pitch is assumed to be 6 μm and the amount of the area occupied by the $p^{++}$-type contact regions 6 is assumed to be 16.7%. In the samples 1 to 4, the layout of the $p^{++}$-type contact regions 6 is the same in both the end side and the center side of the active region 51 (in the figure, indicated as "uniform"). In the samples 1 to 3, the contact holes 11a have the same width and the same length and extend linearly in the first direction X, forming a striped pattern.

The samples 5 to 7 are vertical SiC-MOSFETs with a planar gate structure in which the surface areas of the $p^{++}$-type contact regions, which are disposed apart from one another in island-like shapes (dot shapes) in the active region, are increased locally. In the samples 5 to 7, the cell pitch is assumed to be 10.2 μm and the amount of the area occupied by the p$^{++}$-type contact regions is assumed to be 13.7%. In particular, in the samples 5 to 7, only an outermost one of the p$^{++}$-type contact regions in the second direction Y extends linearly in the first direction X and a width in the second direction Y is relatively wide (corresponds to the portion 104*b* of the p$^{++}$-type contact regions 111, facing the p$^{++}$-type outer peripheral contact region 113 in the second direction Y, in the conventional structure depicted in FIGS. 9A, 10A).

Figure 9A:
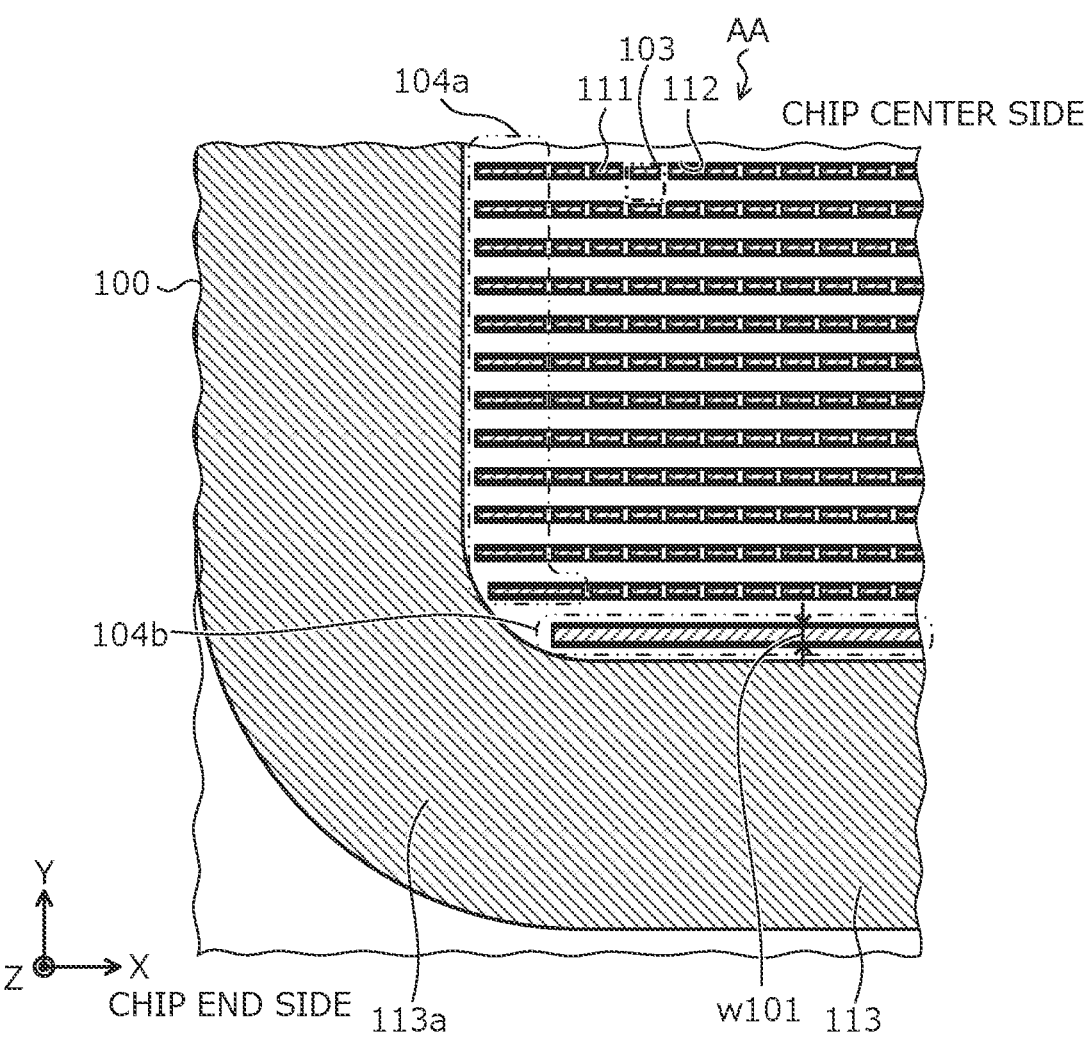
FIG. 9A is an enlarged plan view of a portion of FIG. 8.
Figure 9B:
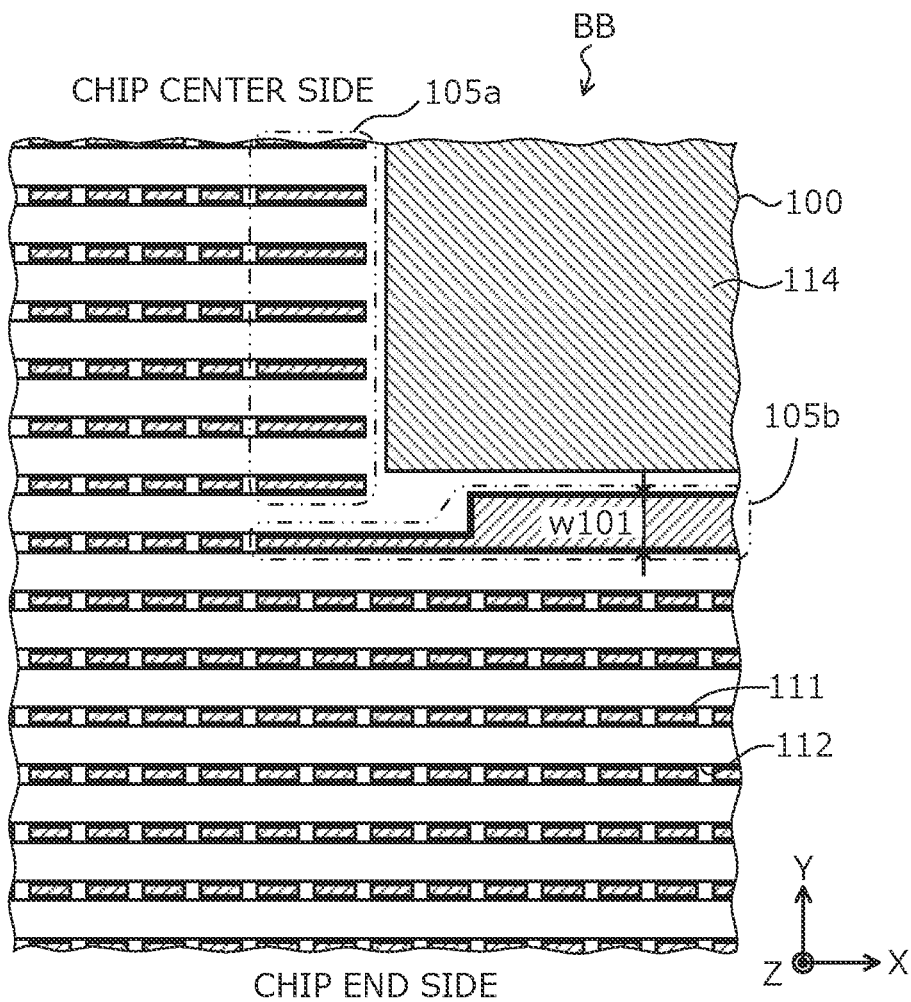
FIG. 9B is an enlarged plan view of a portion of FIG. 8.
Figure 10A:
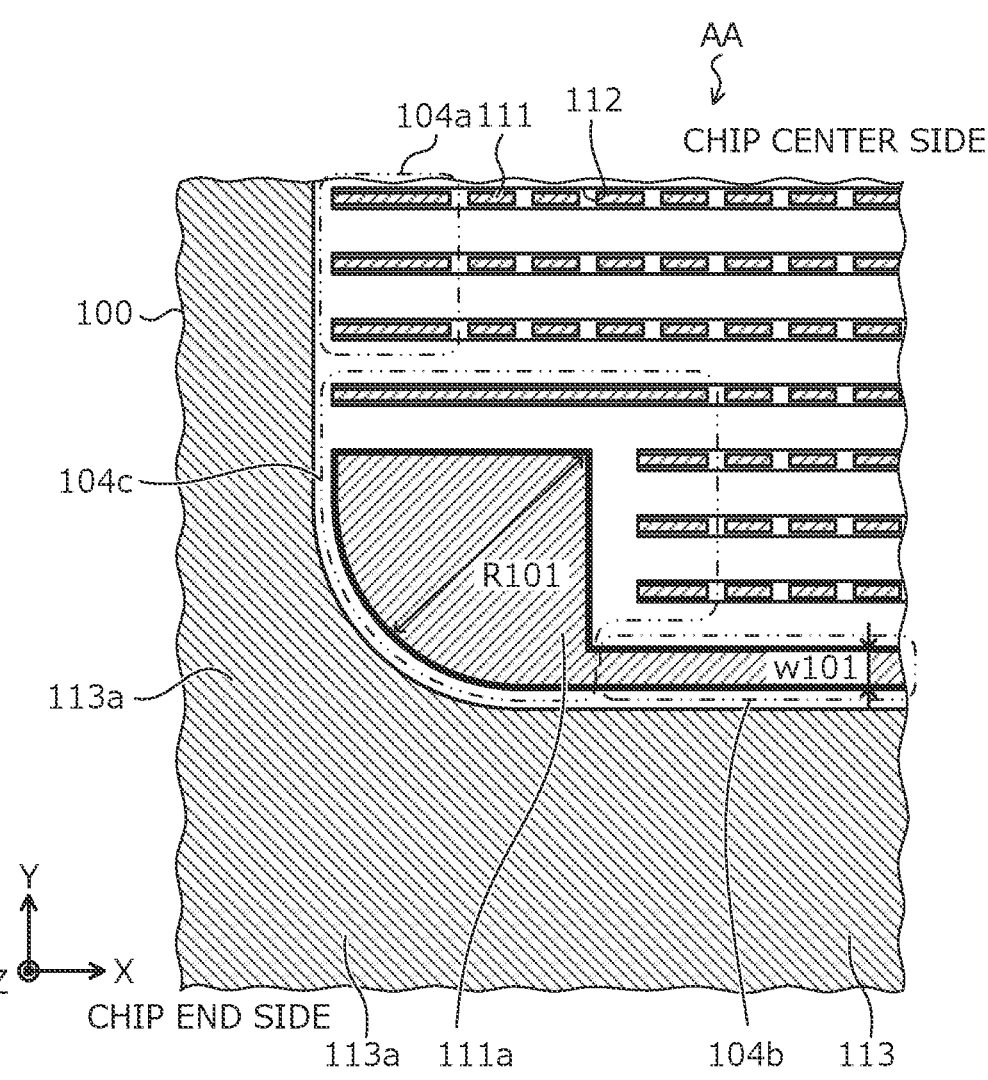
FIG. 10A is an enlarged plan view of a portion of FIG. 8.
Figure 10B:
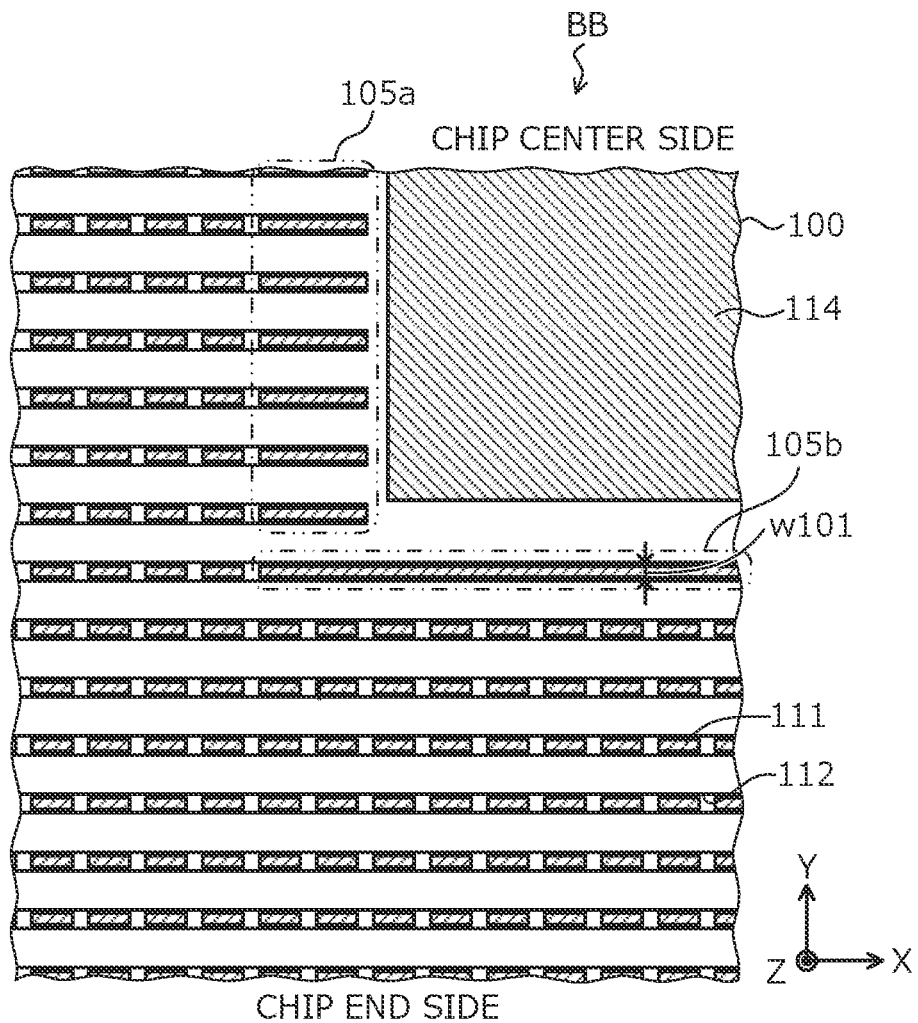
FIG. 10B is an enlarged plan view of a portion of FIG. 8.
Figure 11A:
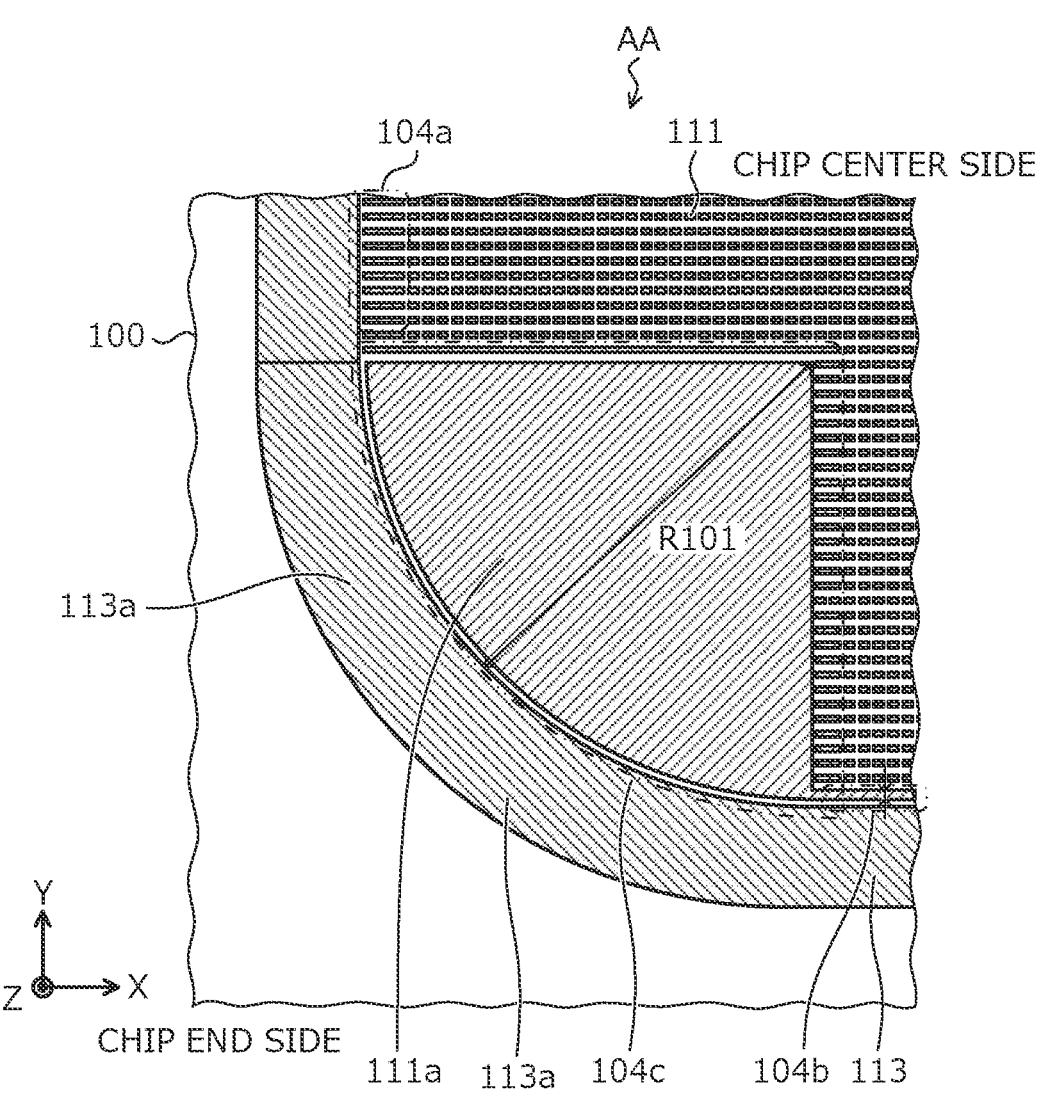
FIG. 11A is an enlarged plan view of a portion of FIG. 8.
Figure 11B:
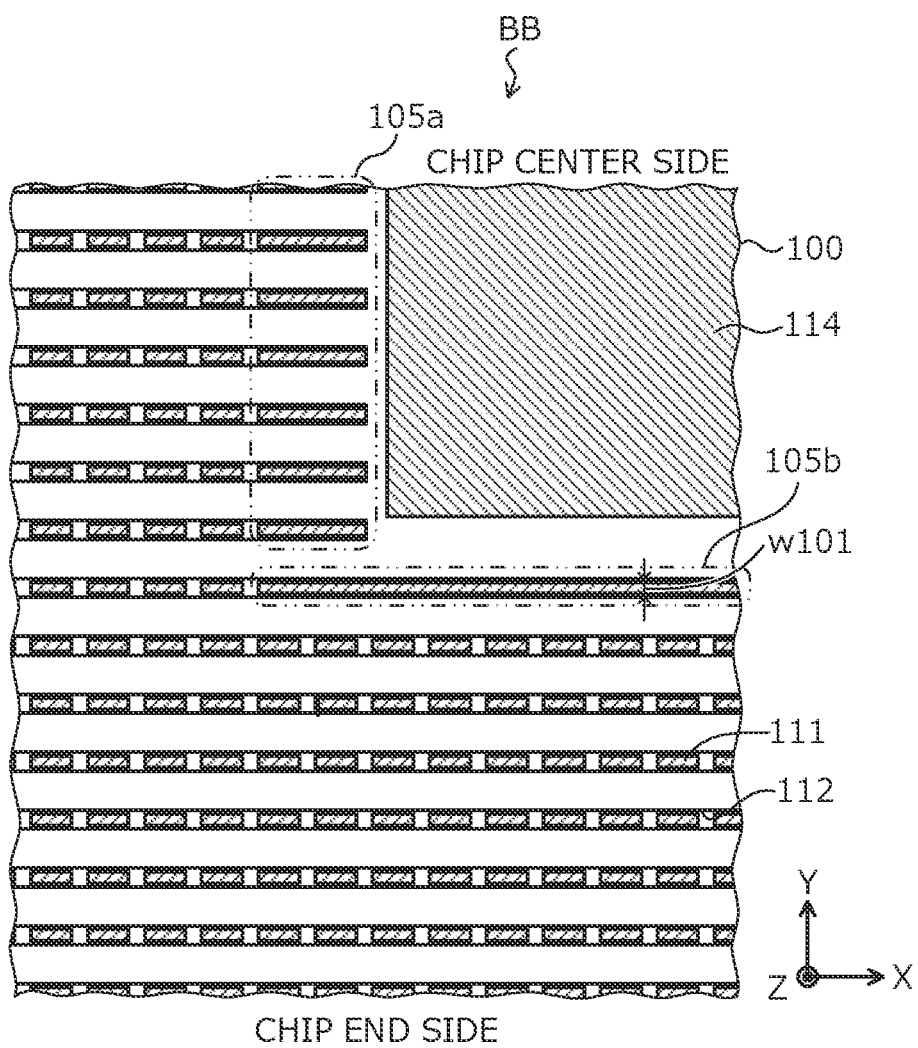
FIG. 11B is an enlarged plan view of a portion of FIG. 8.

In addition, in the samples 6 and 7, the outermost one of the p$^{++}$-type contact regions in the second direction Y has an end in the second direction Y, that in the plan view has a fan-like shape with a center angle of 90 degrees and an arc-shape along an inner periphery of a corner of the active region, at a portion facing the corner of the active region (corresponds to the portion 104*c* of the p$^{++}$-type contact regions 111, facing the corner 113*a* of the p$^{++}$-type outer peripheral contact region 113, in the conventional structure depicted in FIGS. 9A and 10A). The end of the outermost one of the p$^{++}$-type contact regions in the second direction Y has a radius r (corresponds to R101) of 30 μm in the sample 6 and 300 μm in the sample 7.

Results of conducting the body diodes of the samples 1, 2, 3, 4, 5, 6, and 7 of the experimental example to verify the presence/absence of bipolar degradation defects are shown in FIG. 7B (results for the sample 4 are not depicted). In FIG. 7B, measurements 1, 2, 3, 4, 5, 6, 7, 8, 9, 10, 11, 12, and 13 are set so that the greater is the measurement number (Measurement No.), generally, the larger is the current load and the stricter are the conditions. For the measurements 1, 2, and 3, current densities in the forward direction were 100 A/cm$^2$, 200 A/cm$^2$, and 300 A/cm$^2$ in the body diode of the SiC-MOSFET and direct current was passed therethrough for 20 minutes. For the measurement 4, the current density in the forward direction of the body diode of the SiC-MOSFET was 100 A/cm$^2$ and direct current was passed therethrough for 60.

For the measurement 5, the current density in the forward direction of the body diode of the SiC-MOSFET was 400 A/cm$^2$ and direct current was passed therethrough for 5 minutes. For the measurement 6, the current density in the forward direction of the body diode of the SiC-MOSFET の body diode was 350 A/cm$^2$ and direct current was passed therethrough for 20 minutes. For the measurements 7 to 13, the current densities in the forward direction of the body diode of the SiC-MOSFET were 400 A/cm$^2$, 500 A/cm$^2$, 600 A/cm$^2$, 700 A/cm$^2$, 800 A/cm$^2$, 900 A/cm$^2$, and 1000 A/cm$^2$, respectively, and pulsed current was passed therethrough for 20 minutes.

As for the samples of the experimental example, in the samples 1 to 3, the measurements 4 to 13 were performed sequentially. In the samples 1 to 3, the measurements 1 to 3 in which the current load is smaller than that of the measurement 4, were not performed. In the sample 4, the measurement 4 was performed. In the samples 5 and 6, sequentially from the measurement 1 to the measurement 9 in which a bipolar degradation defect occurred in all the evaluated chips (evaluated semiconductor chips) were performed. In the samples 5 and 6, the measurements 10 to 13 for which the current load is greater than that of the measurement 9 were not performed. In the sample 7, sequentially from the measurement 1 to the measurement 7 in which a bipolar degradation defect occurred in all the evaluated chips were performed. In the sample 7, the measurements 8 to 13 for which the current load is greater than that of the measurement 7 were not performed.

In FIG. 7B, results for measurement conditions under which the current load to the evaluated chips was progressively increased and the number of defects increased are indicated in bold lettering. From the results of the samples 5 to 7 of the experimental example depicted in FIG. 7B, it was confirmed that at a portion facing a corner of the active region, bipolar degradation defects occur at a lower current density (measurement conditions for small measurement numbers), the greater is the relative amount of the surface area of the p$^{++}$-type contact regions. In the sample 7, in which the outermost one of the p$^{++}$-type contact regions in the second direction Y, has a fan-like shape in the plan view and the end thereof in the second direction Y has the radius r of 300 μm, which is large, it was confirmed that stacking faults concentrate and are generated from the contact hole that exposes the end of the fan-like shape in the plan view.

On the other hand, from the results of the samples 1 to 3 of the experimental example depicted in FIG. 7B, it was confirmed that for the samples 1 to 3, even under the measurement conditions of a large current load, the probability of occurrence of a bipolar degradation defect is small as compared to the samples 5 to 7. In other words, like the silicon carbide semiconductor device 10 according to the embodiment described above, the p$^{++}$-type contact regions 6 and the contact holes 11*a* are disposed in a layout that is uniform spanning an entire area of the active region 51 so that both the center side and the end side of the active region 51 have the same layout, whereby increases in the hole current density at an interface between the n$^+$-type starting substrate 31 and the n$^-$-type epitaxial layer 32 are suppressed and bipolar degradation may be suppressed.

Further, from the results of the samples 1 to 3 of the experimental example depicted in FIG. 7B, it was confirmed that the probability of occurrence of bipolar degradation defects may be reduced the smaller is the amount of the area occupied by the p$^{++}$-type contact regions 6. Therefore, preferably, the amount of the area occupied by the p$^{++}$-type contact regions 6 may be small. Further, while not depicted, for the sample 4, results of the measurement 4 confirmed that all the evaluated chips of the sample 4 were free of bipolar degradation defects. Further, as for the sample 4, the presence or absence of bipolar degradation defects is estimated by detecting stacking faults, based on photo luminescence (PL) in the semiconductor substrate 30.

In the sample 4, the amount of the area occupied by the p$^{++}$-type contact regions 6 is set to be between the amount of the area occupied by the p$^{++}$-type contact regions 6 in the sample 2 and the amount of the area occupied by the p$^{++}$-type contact regions 6 in the sample 3. Therefore, in an instance in which the measurements 5 to 13 are performed sequentially for the sample 4, as verification results for the sample 4, it is presumed that a probability of occurrence of bipolar degradation defect between the verification results for the sample 2 and the verification results for the sample 3 are obtained. Accordingly, it was confirmed that by disposing the p$^{++}$-type contact regions 6 and the contact holes 11*a* in a layout that is uniform spanning an entire area of the active region 51, bipolar degradation defects may be suppressed independent of the pattern of the layout.

In the foregoing, the present invention may be variously modified, for example, in the embodiments described above, dimensions, impurity concentrations, etc. of regions, the cell pitch, etc. may be suitably set according to necessary specifications. For example, the cell pitch and the amount of the area occupied by the p$^{++}$-type contact regions of the samples 1 to 4 of the experimental example correspond to the silicon carbide semiconductor device according to the embodiment (vertical SiC-MOSFET with a trench structure) described above are one example and the cell pitch may be about 5.2 μm and the amount of the area occupied by the p⁺⁺-type contact regions may be about 19.2%.

Further, even in an instance in which an electrode pad other than the gate pad is provided in the active region, the p⁺⁺-type regions are disposed directly beneath the electrode pad, similarly as with the gate pad. Further, the positional relationship between the p⁺⁺-type regions directly beneath the electrode pad and the p⁺⁺-type contact regions of SiC-MOSFET in the first and second directions is set to be the same as the positional relationship between the p⁺⁺-type regions directly beneath the gate pad and the p⁺⁺-type contact regions of the SiC-MOSFET in the first and second directions.

According to the invention described above, variation of resistance in the semiconductor substrate at the surface of the active region may be suppressed. As a result, variation of current density of forward current (hole current) of the body diode at the surface of the active region may be suppressed and thus, even when the body diode conducts, increases in the hole current density in the semiconductor substrate may be suppressed.

The silicon carbide semiconductor device according to the present invention achieves an effect in that bipolar degradation may be suppressed.

As described, the silicon carbide semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide and having an active region, the semiconductor substrate having a first main surface and a second main surface opposite to each other;
a first semiconductor region of a first conductivity type, provided in the semiconductor substrate;
a second semiconductor region of a second conductivity type, provided in the active region, between the first main surface of the semiconductor substrate and the first semiconductor region;
a plurality of third semiconductor regions of the first conductivity type, selectively provided between the first main surface and the second semiconductor region;
a plurality of fourth semiconductor regions of the second conductivity type, selectively provided between the first main surface and the second semiconductor region, an impurity concentration of the plurality of fourth semiconductor regions being higher than an impurity concentration of the second semiconductor region;
a plurality of trenches penetrating through the third semiconductor regions and the second semiconductor region;
a plurality of gate electrodes, each provided in a corresponding one of the trenches with a gate insulating film;
an interlayer insulating film provided at the first main surface, the interlayer insulating film covering the plurality of gate electrodes;

a plurality of contact holes penetrating through the interlayer insulating film in a depth direction of the silicon carbide semiconductor device and reaching the first main surface, each contact hole of the plurality of contact holes exposing a respective fourth semiconductor region of the plurality of fourth semiconductor regions and a respective third semiconductor region of the plurality of third semiconductor regions;
a first electrode in the plurality of contact holes and in contact with the plurality of third semiconductor regions and the plurality of fourth semiconductor regions;
a second electrode in contact with the second main surface of the semiconductor substrate; and
a fifth semiconductor region of the second conductivity type, selectively provided between the first main surface and the first semiconductor region, the fifth semiconductor region being spaced apart from the plurality of fourth semiconductor regions, surrounding a periphery of the active region in a plan view of the silicon carbide semiconductor device, and being electrically connected to the first electrode, the fifth semiconductor region having a first inner side facing the active region, a second inner side facing the active region and opposite the first inner side, a third inner side facing the active region, and a fourth inner side facing the active region and opposite the third inner side; wherein
the plurality of fourth semiconductor regions are regularly disposed in an entire area of the active region,
the plurality of contact holes extend in a first direction orthogonal to the depth direction to have a stripe pattern in the plan view and are regularly disposed in a second direction orthogonal to the depth direction and orthogonal to the first direction from the first inner side of the fifth semiconductor region to the second inner side of the fifth semiconductor region,
each contact hole of the plurality of contact holes has a width in the second direction, the width being constant from an end closest to the third inner side to an end closest to the fourth inner side, the width of each contact hole of the plurality of contact holes being the same.

2. The silicon carbide semiconductor device according to claim 1, wherein the plurality of trenches extends in the first direction to have a stripe pattern; each fourth semiconductor region of the plurality of fourth semiconductor regions is disposed between a corresponding adjacent two of the plurality of trenches, has a same width in the second direction, and extends linearly to have a same length in the first direction.

3. The silicon carbide semiconductor device according to claim 2, wherein a shortest distance in the first direction to the fifth semiconductor region from each of the plurality of fourth semiconductor regions that face the fifth semiconductor region is the same.

4. The silicon carbide semiconductor device according to claim 3,
wherein
the active region has, in a plan view of the silicon carbide semiconductor device, a rectangular shape with rounded corners, and
the fifth semiconductor region surrounds the periphery of the active region so as to have a rectangular shape with rounded corners in the plan view.

5. The silicon carbide semiconductor device according to claim 2, further comprising a sixth semiconductor region of the second conductivity type, provided between the first main surface and the second semiconductor region, the sixth semiconductor region being apart from the plurality of fourth semiconductor regions, being electrically connected to the first electrode, and having an impurity concentration that is higher than the impurity concentration of the second semiconductor region, wherein a shortest distance in the first direction to the sixth semiconductor region from each of the plurality of fourth semiconductor regions that face the sixth semiconductor region is the same.

6. The silicon carbide semiconductor device according to claim 5, further comprising a gate pad provided on the interlayer insulating film, apart from the first electrode, the plurality of gate electrodes being electrically connected to the gate pad, wherein an entire surface of the gate pad faces the sixth semiconductor region via the interlayer insulating film.

7. The silicon carbide semiconductor device according to claim 1, wherein the plurality of trenches extends in the first direction to have a stripe pattern; the plurality of fourth semiconductor regions are each disposed between a corresponding adjacent two of the plurality of trenches, have a shape and dimensions identical to one another in the plan view, and are apart from one another at a same interval in the first direction.

8. The silicon carbide semiconductor device according to claim 7, wherein a shortest distance in the first direction to the fifth semiconductor region from each of the plurality of fourth semiconductor regions that face the fifth semiconductor region is the same.

9. The silicon carbide semiconductor device according to claim 8, wherein the active region has, in the plan view, a rectangular shape with rounded corners, and the fifth semiconductor region surrounds the periphery of the active region so as to have a rectangular shape with rounded corners in the plan view.

10. The silicon carbide semiconductor device according to claim 7, further comprising a sixth semiconductor region of the second conductivity type, provided between the first main surface and the second semiconductor region, the sixth semiconductor region being apart from the plurality of fourth semiconductor regions, being electrically connected to the first electrode, and having an impurity concentration that is higher than the impurity concentration of the second semiconductor region, wherein a shortest distance in the first direction to the sixth semiconductor region from each of the plurality of fourth semiconductor regions that face the sixth semiconductor region is the same.

11. The silicon carbide semiconductor device according to claim 10, further comprising a gate pad provided on the interlayer insulating film, apart from the first electrode, the plurality of gate electrodes being electrically connected to the gate pad, wherein an entire surface of the gate pad faces the sixth semiconductor region via the interlayer insulating film.

12. The silicon carbide semiconductor device according to claim 1, wherein the active region has a rectangular shape with rounded corners in the plan view, a first one of the plurality of fourth semiconductor regions faces one of the corners of the active region in the first direction, and a second one of the plurality of fourth semiconductor regions faces an outer peripheral edge of the active region in the first direction, the outer peripheral edge connecting two of the corners of the active region, and a first shortest distance between the first one of the plurality of fourth semiconductor regions and the one of the corners of the active region is equal to a second shortest distance between the second one of the plurality of fourth semiconductor regions and the outer peripheral edge.

13. The silicon carbide semiconductor device according to claim 1, wherein the semiconductor substrate has:

a starting substrate of the first conductivity type, the starting substrate containing silicon carbide and constituting a seventh semiconductor region, the starting substrate having an impurity concentration that is higher than an impurity concentration of the first semiconductor region, and a first-conductivity-type epitaxial layer provided on the starting substrate and constituting the first semiconductor region.

\* \* \* \* \*